(12) United States Patent
Ozawa et al.

(10) Patent No.: US 9,514,794 B2
(45) Date of Patent: Dec. 6, 2016

(54) INFORMATION PROCESSING APPARATUS, INFORMATION PROCESSING SYSTEM AND PHASE ADJUSTING METHOD

(71) Applicant: FUJITSU LIMITED, Kawasaki-shi, Kanagawa (JP)

(72) Inventors: Toshiaki Ozawa, Yokohama (JP); Shinya Aiso, Kawasaki (JP); Keiji Shimatani, Nerima (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/088,459

(22) Filed: Apr. 1, 2016

(65) Prior Publication Data

US 2016/0293237 A1 Oct. 6, 2016

(30) Foreign Application Priority Data

Apr. 2, 2015 (JP) ................................. 2015-075748

(51) Int. Cl.
*G11C 7/00* (2006.01)
*G11C 7/22* (2006.01)

(52) U.S. Cl.
CPC ....................................... *G11C 7/22* (2013.01)

(58) Field of Classification Search
CPC ........ G11C 7/22; G11C 7/1066; G11C 7/1051
USPC .................................... 365/193, 194, 189.07
See application file for complete search history.

(56) References Cited

U.S. PATENT DOCUMENTS

| 7,123,524 B1* | 10/2006 | Han ..................... G11C 7/1051 327/3 |
| 7,991,098 B2 | 8/2011 | Hollis |
| 2010/0118627 A1* | 5/2010 | Best ................... G06F 13/1689 365/193 |

FOREIGN PATENT DOCUMENTS

| JP | 5-342085 | 12/1993 |
| JP | 2003-099321 | 4/2003 |
| JP | 2011-253501 | 12/2011 |

* cited by examiner

*Primary Examiner* — Son Dinh
(74) *Attorney, Agent, or Firm* — Fujitsu Patent Center

(57) ABSTRACT

An information processing apparatus configured to adjust a phase relation between a data signal and a strobe signal includes a processor and memory. The memory stores instructions for causing the processor to execute identifying, for each of a plurality of candidates for reference values used to perform a determination regarding a value of the data signal, at least one phase difference between the data signal and the strobe signal for successfully acquiring the data signal according to the strobe signal, determining a reference value of the plurality of candidates for which a period for successfully acquiring the data signal is longer than periods for any other candidates based on the identified phase difference for each candidate, and adjusting the phase relation between the data signal and the strobe signal based on the period for the determined reference value.

20 Claims, 16 Drawing Sheets

FIG. 2

VrefDQm SETTING REGISTER (m = 0~3)

| bit | 7 | 6 | 5 | 4 | 3 | 2 | 1 | 0 |
|---|---|---|---|---|---|---|---|---|
| CONTENT | SET VALUE | | | | | | | |

DQm DELAY TAP SETTING REGISTER (m = 0~3)

| bit | 7 | 6 | 5 | 4 | 3 | 2 | 1 | 0 |
|---|---|---|---|---|---|---|---|---|
| CONTENT | SET VALUE | | | | | | | |

DQS DELAY TAP SETTING REGISTER

| bit | 7 | 6 | 5 | 4 | 3 | 2 | 1 | 0 |
|---|---|---|---|---|---|---|---|---|
| CONTENT | SET VALUE | | | | | | | |

WRITE/READ INSTRUCTION REGISTER

| bit | 7 | 6 | 5 | 4 | 3 | 2 | 1 | 0 |
|---|---|---|---|---|---|---|---|---|
| CONTENT | - | - | - | - | - | - | READ INSTRUCTION WHEN 1 IS STORED, READ IS EXECUTED. | WRITE INSTRUCTION WHEN 1 IS STORED, WRITE IS EXECUTED. |

READ RESULT DISPLAY REGISTER

| bit | 7 | 6 | 5 | 4 | 3 | 2 | 1 | 0 |
|---|---|---|---|---|---|---|---|---|
| CONTENT | - | - | - | - | DISPLAY RESULT OF READING DQ3 0···OK 1···NG | DISPLAY RESULT OF READING DQ2 0···OK 1···NG | DISPLAY RESULT OF READING DQ1 0···OK 1···NG | DISPLAY RESULT OF READING DQ0 0···OK 1···NG |

| Verf | \ | | | | | | | DQS DELAY TAP | | | | | | | | |
|---|---|---|---|---|---|---|---|---|---|---|---|---|---|---|---|---|
| | -7 | -6 | -5 | -4 | -3 | -2 | -1 | 0 | 1 | 2 | 3 | 4 | 5 | 6 | 7 | 8 |
| 0 | × | × | × | × | × | × | O | × | O | O | × | × | × | × | × | × |
| 1 | × | × | × | × | × | O | O | O | O | O | O | × | × | × | × | × |
| 2 | × | × | × | × | O | O | O | O | O | O | O | O | O | × | × | × |
| 3 | × | × | × | × | O | O | O | O | O | O | O | O | O | × | × | × |
| 4 | × | × | × | × | O | O | O | O | O | O | O | O | O | × | × | × |
| 5 | × | × | × | × | × | O | O | O | O | O | O | × | × | × | × | × |
| 6 | × | × | × | × | × | × | O | O | O | O | × | × | × | × | × | × |
| 7 | × | × | × | × | × | × | O | O | × | O | × | × | × | × | × | × |

DQ1

| Verf | \ | | | | | | | DQS DELAY TAP | | | | | | | | |
|---|---|---|---|---|---|---|---|---|---|---|---|---|---|---|---|---|
| | -7 | -6 | -5 | -4 | -3 | -2 | -1 | 0 | 1 | 2 | 3 | 4 | 5 | 6 | 7 | 8 |
| 0 | × | × | × | × | × | × | × | × | × | × | × | × | × | × | × | × |
| 1 | × | × | × | × | × | × | O | × | × | O | × | × | × | × | × | × |
| 2 | × | × | × | × | × | O | O | O | × | O | O | × | × | × | × | × |
| 3 | × | × | × | O | O | O | O | O | O | O | O | O | O | O | O | × |
| 4 | × | × | × | O | O | O | O | O | O | O | O | O | O | O | O | × |
| 5 | × | × | × | × | O | O | O | O | O | O | O | × | × | × | × | × |
| 6 | × | × | × | × | × | O | O | O | O | O | × | × | × | × | × | × |
| 7 | × | × | × | × | × | × | × | O | O | × | × | × | × | × | × | × |

DQ2

| Verf | \ | | | | | | | DQS DELAY TAP | | | | | | | | |
|---|---|---|---|---|---|---|---|---|---|---|---|---|---|---|---|---|
| | -7 | -6 | -5 | -4 | -3 | -2 | -1 | 0 | 1 | 2 | 3 | 4 | 5 | 6 | 7 | 8 |
| 0 | × | × | × | × | × | × | O | × | × | × | × | × | × | × | × | × |
| 1 | × | × | × | × | × | O | O | O | O | × | × | × | × | × | × | × |
| 2 | × | × | × | × | O | O | O | O | O | O | × | × | × | × | × | × |
| 3 | × | × | O | O | O | O | O | O | O | O | O | × | × | × | × | × |
| 4 | × | × | × | × | O | O | O | O | O | O | O | O | × | × | × | × |
| 5 | × | × | × | × | × | O | O | O | O | O | × | × | × | × | × | × |
| 6 | × | × | × | × | × | O | O | O | O | × | × | × | × | × | × | × |
| 7 | × | × | × | × | × | × | × | O | × | × | × | × | × | × | × | × |

DQ3

| Verf | \ | | | | | | | DQS DELAY TAP | | | | | | | | |
|---|---|---|---|---|---|---|---|---|---|---|---|---|---|---|---|---|
| | -7 | -6 | -5 | -4 | -3 | -2 | -1 | 0 | 1 | 2 | 3 | 4 | 5 | 6 | 7 | 8 |
| 0 | × | × | × | × | × | × | × | × | O | O | × | × | × | × | × | × |
| 1 | × | × | × | × | × | × | × | O | O | O | O | × | × | × | × | × |
| 2 | × | × | × | × | × | × | O | O | O | O | O | O | × | × | × | × |
| 3 | × | × | × | × | O | O | O | O | O | O | O | O | × | × | × | × |
| 4 | × | × | × | × | × | O | O | O | O | O | O | O | × | × | × | × |
| 5 | × | × | × | × | × | × | O | O | O | O | O | × | × | × | × | × |
| 6 | × | × | × | × | × | × | × | O | O | O | × | × | × | × | × | × |
| 7 | × | × | × | × | × | × | × | × | O | O | × | × | × | × | × | × |

FIG. 10A

| | Verf | \multicolumn{16}{c}{DQS DELAY TAP} |
|---|---|---|---|---|---|---|---|---|---|---|---|---|---|---|---|---|---|
| | | -7 | -6 | -5 | -4 | -3 | -2 | -1 | 0 | 1 | 2 | 3 | 4 | 5 | 6 | 7 | 8 |
| DQ[0] | 3 | × | × | × | × | O | O | O | O | O | O | O | O | × | × | × | × |
| DQ[1] | 4 | × | × | × | O | O | O | O | O | O | O | O | O | O | O | O | × |
| DQ[2] | 3 | × | × | O | O | O | O | O | O | O | O | × | × | × | × | × | × |
| DQ[3] | 3 | × | × | × | × | O | O | O | O | O | O | O | O | O | × | × | × |

FIG. 10B

| | Verf | \multicolumn{16}{c}{DQS DELAY TAP} |
|---|---|---|---|---|---|---|---|---|---|---|---|---|---|---|---|---|---|
| | | -7 | -6 | -5 | -4 | -3 | -2 | -1 | 0 | 1 | 2 | 3 | 4 | 5 | 6 | 7 | 8 |
| DQ[0] | 3 | × | × | × | × | O | O | O | O | O | O | O | O | × | × | × | × |
| DQ[1] | 4 | × | × | × | O | O | O | O | O | O | O | O | O | O | O | O | × |
| DQ[2] | 3 | × | × | O | O | O | O | O | O | O | O | × | × | × | × | × | × |
| DQ[3] | 3 | × | × | × | × | O | O | O | O | O | O | O | O | O | × | × | × |

FIG. 10C

| | Verf | \multicolumn{16}{c}{DQS DELAY TAP} |
|---|---|---|---|---|---|---|---|---|---|---|---|---|---|---|---|---|---|
| | | -7 | -6 | -5 | -4 | -3 | -2 | -1 | 0 | 1 | 2 | 3 | 4 | 5 | 6 | 7 | 8 |
| DQ[0] | 3 | × | × | × | × | O | O | O | O | O | O | O | O | O | × | × | × |
| DQ[1] | 4 | × | × | × | O | O | O | O | O | O | O | O | O | O | O | O | × |
| DQ[2] | 3 | × | × | O | O | O | O | O | O | O | O | O | × | × | × | × | × |
| DQ[3] | 3 | × | × | × | × | O | O | O | O | O | O | O | O | O | × | × | × |

FIG. 10D

| | \multicolumn{16}{c}{DQS DELAY TAP} |
|---|---|---|---|---|---|---|---|---|---|---|---|---|---|---|---|---|
| | \multicolumn{8}{c}{SETUP} | \multicolumn{8}{c}{HOLD} |
| DQ[0] | × | × | × | O | O | O | O | O | O | O | O | O | × | × | × | × |
| DQ[1] | × | O | O | O | O | O | O | O | O | O | O | O | O | × | × | × |
| DQ[2] | × | × | × | O | O | O | O | O | O | O | O | × | × | × | × | × |
| DQ[3] | × | × | O | O | O | O | O | O | O | O | O | O | × | × | × | × |

FIG. 10E

| | Verf | \-7 | \-6 | \-5 | \-4 | \-3 | \-2 | \-1 | 0 | 1 | 2 | 3 | 4 | 5 | 6 | 7 |
|---|---|---|---|---|---|---|---|---|---|---|---|---|---|---|---|---|
| | | DQS DELAY TAP | | | | | | | | | | | | | | |
| DQ[0] | 3 | × | ○ | ○ | ○ | ○ | [○] | ○ | ○ | ○ | × | × | × | × | × | × |
| DQ[1] | 4 | × | × | × | × | ○ | ○ | [○] | ○ | × | × | × | × | × | × | × |
| DQ[2] | 3 | × | × | ○ | ○ | [○] | ○ | ○ | × | × | × | × | × | × | × | × |
| DQ[3] | 3 | × | × | × | ○ | ○ | ○ | [○] | ○ | ○ | ○ | × | × | × | × | × |

FIG. 10F

| | DQS DELAY TAP | | | | | | | | | | | | | | |
|---|---|---|---|---|---|---|---|---|---|---|---|---|---|---|---|
| | SETUP | | | | | | | HOLD | | | | | | | |
| DQ[0] | × | × | × | ○ | ○ | ○ | ○ | [○] | ○ | ○ | ○ | × | × | × | × |
| DQ[1] | × | × | × | × | × | ○ | ○ | [○] | ○ | × | × | × | × | × | × |
| DQ[2] | × | × | × | × | × | ○ | ○ | [○] | ○ | ○ | × | × | × | × | × |
| DQ[3] | × | × | × | × | ○ | ○ | ○ | [○] | ○ | ○ | ○ | × | × | × | × |

INFORMATION PROCESSING APPARATUS, INFORMATION PROCESSING SYSTEM AND PHASE ADJUSTING METHOD

CROSS-REFERENCE TO RELATED APPLICATION

This application is based upon and claims the benefit of priority of the prior Japanese Patent Application No. 2015-075748, filed on Apr. 2, 2015, the entire contents of which are incorporated herein by reference.

FIELD

The embodiments discussed herein pertain to an information processing apparatus, information processing system and a method of controlling information processing apparatus.

BACKGROUND

Data strobe signals (DQS signals) are used for writing and reading of multiple-bit data signals, that is DQ signals when a Central Processing Unit (CPU) performs data input and output to memory. When DQ signals are written to the memory, a memory controller shifts the phase difference between the phase of a DQS signal and the phase of a DQ signal to 90° to each other. In addition, when DQ signals are read from the memory, the memory outputs a DQS signal and a DQ signal in phase. And then the memory controller shifts the phase difference between the phase of the DQS signal and the phase of the DQ signal to 90° to each other to read the DQ signal.

In the adjustments as described above, the phases of DQS signals are fixed and strobe points for writing or reading DQ signals are set at the leading edges of the DQS signals. A plurality of bits of DQ signals are arranged into a group and writing and reading of the plurality of bits of the DQ signals are performed by one DQS signal.

Since each bit of the DQ signals is transmitted via a different transmission line, a certain phase difference between each DQ signal occurs. Therefore, the phase of each DQ signal is adjusted to be in phase based on the strobe point of DQS signal.

In addition, it is conventional to use an eye pattern to adjust the phases of the DQS signals and DQ signals (See patent document 1). Firstly, the phase at which the width of the reference voltage becomes the maximum and the voltage at which the width of the phase for acquiring DQ signal data becomes the maximum are determined in the direction of the reference voltage and the direction of the phase of DQ signal in the eye pattern. And then the strobe point between the DQ signal and the DQS signal are optimized using the determined phase and voltage.

The following patent document describes conventional techniques related to the techniques described herein.

PATENT DOCUMENT

[Patent document 1] U.S. Pat. No. 7,991,098

SUMMARY

According to one embodiment, it is provided an information processing apparatus configured to adjust a phase relation between a data signal and a strobe signal, the information processing apparatus including a processor, and memory storing instructions for causing the processor to execute identifying, for each of a plurality of candidates for reference values used to perform a determination regarding a value of the data signal, at least one phase difference between the data signal and the strobe signal for successfully acquiring the data signal according to the strobe signal, determining a reference value of the plurality of candidates for which a period for successfully acquiring the data signal is longer than periods for any other candidates based on the identified phase difference for each candidate, and adjusting the phase relation between the data signal and the strobe signal based on the period for the determined reference value.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 2 is a diagram schematically illustrating configurations of registers of an information processing apparatus according to an embodiment;

FIG. 6 is a diagram illustrating an example of data acquisition determination results according to an embodiment;

FIG. 10A is a diagram illustrating an example of data acquisition determination results according to an embodiment;

FIG. 10B is a diagram illustrating an example of data acquisition determination results according to an embodiment;

FIG. 10C is a diagram illustrating an example of data acquisition determination results according to an embodiment;

FIG. 10D is a diagram illustrating an example of data acquisition determination results according to an embodiment;

FIG. 10E is a diagram illustrating an example of data acquisition determination results according to an embodiment;

FIG. 10F is a diagram illustrating an example of data acquisition determination results according to an embodiment;

DESCRIPTION OF EMBODIMENTS

Figure 1:
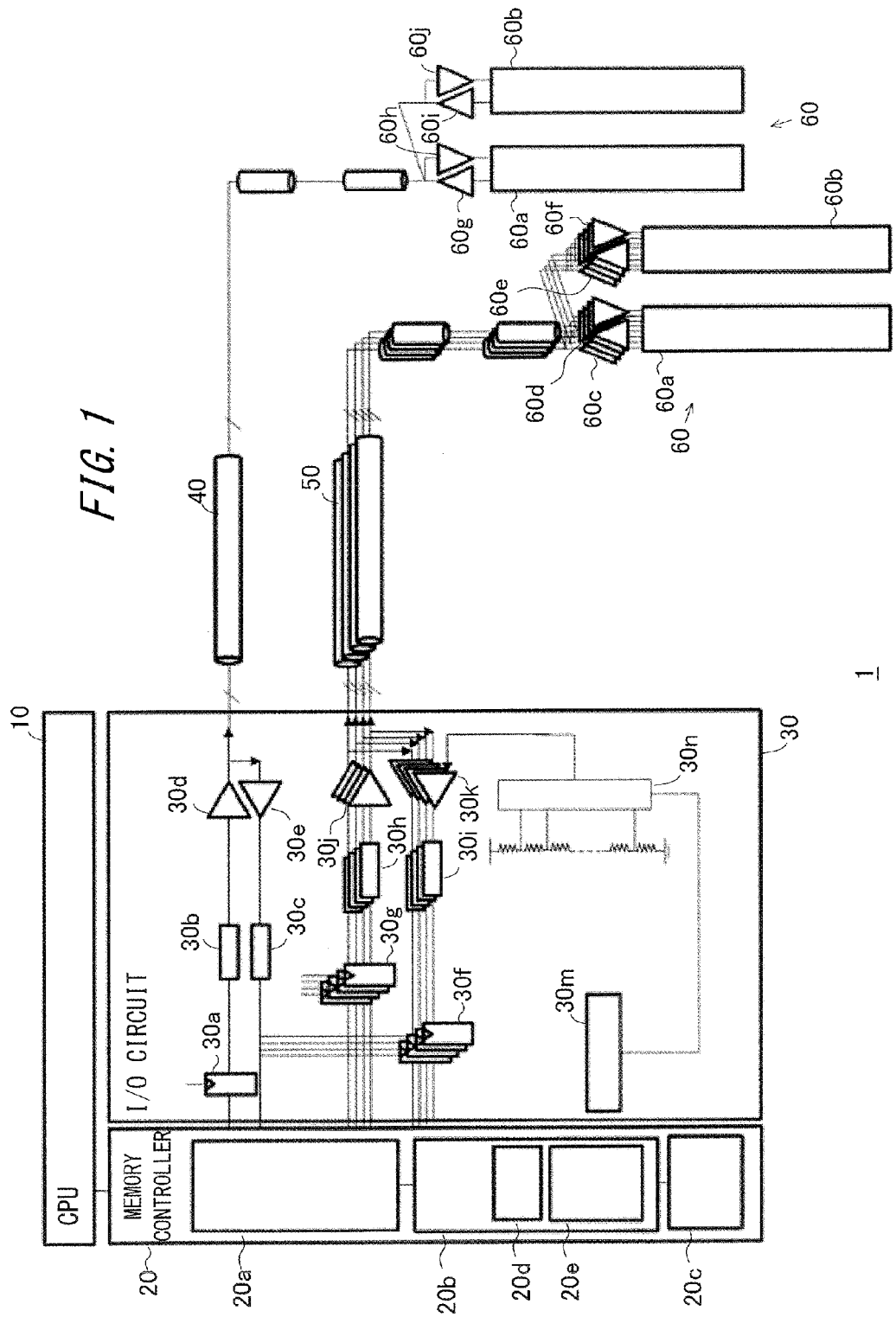
FIG. 1 is a diagram schematically illustrating a configuration of an information processing apparatus according to an embodiment.

When a strobe point is determined by a DQS signal with the phase fixed, the strobe point can be changed by the influence of the variation of processes in the CPU and the memory. Therefore, the strobe point can be shifted to the setup side which is prior to the rising edge or the falling edge of the DQS signal in terms of time or to the hold side which is posterior to the rising edge or the falling edge of the DQS signal in terms of time. In addition, a plurality of memory modules are connected to the signal transmission lines in order to increase the storage capacity per memory channel in memory accesses with a large amount of memory. However, the number of branches in the transmission lines also increases since a plurality of memory modules are connected to the signal transmission lines. Therefore, impedance mismatches between the transmission lines and the memory modules can occur at the branches, and multiple reflections of the transmitted signals also occur. As a result, the contour of the eye of the eye pattern may have concavity portions and convexity portions due to the reflected waves. When the contour of the eye of the eye pattern has concavity portions and convexity portions, that is the waveform of the data signal is distorted, the phase at which the width of the reference voltage becomes the maximum and the voltage at which the width of the phase for acquiring the DQ signal becomes the maximum may be determined at the concavity portions or the convexity portions. The phase and the voltage determined in this manner can be different from the phase at which the width of the reference voltage becomes the maximum in the overall portions of the eye pattern and the voltage at which the width of the phase for acquiring the DQ signal becomes the maximum in the overall portions of the eye pattern. Therefore, the phases of the DQS signal and the DQ signal cannot be optimized. When the phases of the DQS signal and the DQ signal are not optimized, the width of the phase or the width of the voltage allowable for the strobe point at which the acquisition of the DQ signal is successful may be narrowed. Therefore, the strobe point at which the acquisition of the DQ signal may fail is set in some cases. Embodiments are described below with reference to the drawings. Configurations of the following embodiments are exemplifications, and the present apparatus is not limited to the configurations of the embodiments.

First Embodiment

An information processing apparatus 1 according to the first embodiment is described below. As illustrated in the schematic configuration diagram in FIG. 1, the information processing apparatus 1 includes a Central Processing Unit (CPU) 10, a memory controller 20, an Input/output (I/O) circuit 30, transmission lines 40, 50 and a memory module 60. In addition, the memory controller 20 includes an internal circuit 20a, a Pseudo Random Bit Sequence (PRBS) generation unit 20b, a data acquisition determination circuit 20c, a start flag 20d and a data acquisition determination register 20e.

The I/O circuit 30 includes latch circuits 30a, 30f, 30g, delay tap setting units 30b, 30c, 30h, 30i, drivers 30d, 30j, receivers 30e, 30k, a reference voltage (Vref) setting unit 30m and a voltage-dividing circuit 30n. The memory module 60 includes a Rank0 memory device 60a, Rank1 memory device 60b, drivers 60c, 60e and receivers 60d, 60f. It is noted in FIG. 1 that two pairs of the memory devices 60a and the memory devices 60b of the memory module 60 indicate the same pair of the memory device 60a and the memory device 60b.

The CPU 10 controls each unit in the information processing apparatus 1 to perform processes as described below. The memory controller 20 performs processes including generation of DQS signals, generation of DQ signals for PRBS test patterns and success and failure determinations of reading of DQ signals with respect to reference voltages. It is noted that the memory controller 20 corresponds to an example of an adjustment unit. It is also noted that the reference voltage corresponds to an example of a reference value for determining a value of a data signal.

The internal circuit 20a of the memory controller 20 outputs PRBS test patterns generated by the PRBS generation unit 20b to the IO circuit 30. The PRBS generation unit 20b generates DQ signals of the PRBS test patterns. It is noted that the PRBS test pattern is not a pattern generated based on combinations of regular patterns of bits including a pattern in which "0" bits and "1" bits alternate and that the PRBS test pattern is a pattern generated based on pseudo-random numbers determined by deterministic calculation of the sequence of "0" and "1". Therefore, DQ signals of PRBS test patterns can be used as signals equivalent to DQ signals used for the actual data transmission.

The start flag 20d is a flag used as a trigger for starting phase adjustment processes in the present embodiment. For example, the CPU 10 sets the start flag 20d to ON or OFF based on the user operations of the information processing apparatus 1. The data acquisition determination unit 20c determines whether data acquisition of a DQ signal is successful when the reference voltage and the phase of a DQS signal are changed. It is noted that the data acquisition determination unit 20c corresponds to an example of a determination unit.

The data acquisition determination register 20e stores the determination results obtained by the data acquisition determination unit 20c. In addition, the data acquisition determination register 20e includes registers as illustrated in FIG. 2 for storing data for performing processes as described below in the present embodiment. The VrefDQm (hereinafter, m is integer from 0 to 3) setting register is a register for storing values of reference voltages used for determining the H levels and the L levels of DQ signals from DQ0 to DQ3. It is noted that the H level and the L level of a DQ signal correspond to examples of values indicated by a data signal. The above register is provided for each DQ signal from DQ0 to DQ3. The CPU 10 sets the values of the VrefDQm setting register.

The DQm delay tap setting register is a register used by the CPU 10 for setting delay taps for the DQ signals from DQ0 to DQ3. The delay tap for a DQ signal in the present embodiment is the amount of delay of the phase of the DQ signal. The register is provided for each DQ signal from DQ0 to DQ3. The DQS delay tap setting register is a register used by the CPU 10 for setting delay taps for DQS signals. The delay tap for a DQS signal in the present embodiment is the amount of delay of the phase of the DQS signal. In the present embodiment, the delay tap setting units 30b, 30c, 30h, 30i adjust the phase differences between DQS signals and DQ signals based on the values stored in the DQm delay tap setting register and the DQS delay tap setting register.

It is noted that binary values are set to the VrefDQm setting register, the DQm delay tap setting register and the DQS delay tap setting register. Therefore, the reference voltages for DQ signals DQm, the delay taps for DQ signals DQm and the delay taps for DQS signals are determined by the values stored in the VrefDQm setting register, the DQm delay tap setting register and the DQS delay tap setting register.

The write/read instruction register is a register used by the CPU 10 for instructing the memory controller 20 to write or read PRBS data generated by the PRBS generation circuit 20b to or from the memory module 60. When the CPU 10 sets "1" for bit 0 in the write/read instruction register as illustrated in FIG. 2, the memory controller 20 is instructed to write PRBS data to the memory module 60. And when the CPU 10 sets "1" for bit 1 in the write/read instruction register, the memory controller 20 is instructed to read PRBS data from the memory module 60.

The read result display register is a register for storing results of reading of PRBS data for DQ signals from DQ0 to DQ3 from the memory module 60. Values "0" or "1" are stored in bit 0 to 3 in the read result display register. The values "0" or "0" indicate whether the reading processes of data from DQ0 to DQ3 are successful. PRBS generation unit 20b generates PRBS data for DQ0 to DQ3 in the present embodiment. Each generated PRBS data is written to the memory module 60. And the written data is read from the memory module 60. And then the CPU 10 determines whether the reading processes of DQ signals are successful based on whether the data generated by the PRBS generation unit 20 matches with the data read from the memory module 60. And the determination results of the data reading are written to the read result display register.

It is noted in the present embodiment that although the registers as described above is included in the data acquisition determination register 20e, one or more of the registers can be provided as registers different from the data acquisition determination register 20e.

The DQS signals output from the memory controller 20 are input into the latch circuit 30a of the I/O circuit 30. Internal clocks are input into the latch circuit 30a to latch data and the latched data is input into the delay tap setting unit 30b. The delay tap setting unit 30b determines the strobe points set by the DQS signals, that is the delay taps for the DQS signals as the time to acquire the DQ signals. In addition, the DQ signals output from the memory controller 20 are input into the latch circuit 30g of the I/O circuit 30. Internal clocks are input into the latch circuit 30g to latch data and the latched data is input into the delay tap setting unit 30h. The delay tap setting unit 30h determines the delay taps for the DQ signals. For example, four bits signals DQ0, DQ1, DQ2 and DQ3 form a DQ signal as a group. Each bit DQ signal is transmitted by parallel transmission using transmission lines which differ from one signal to another.

The delay tap setting unit 30b controls the delay time of the DQS signal using phase widths as step sizes obtained by dividing the phase width for one period of the DQS signal into $2^N$ pieces of width (for example, 32 pieces of width 0 to 31 if N=5). Similarly, the delay tap setting unit 30h uses the divided widths as step sizes to control the delay time of the DQ signal. It is noted that the delay tap setting units 30b, 30c, 30h, 30i are examples of adjustment units. Further, the memory controller 20 sets setting values for the DQm delay tap setting register and the DQS delay tap setting register to the delay tap setting units 30b, 30c, 30h, 30i. For example, the delay tap setting units 30b, 30h identify the phase differences ranging from −180° to +180° between the phases of the DQS signals and the phases of the DQ signals. It is noted in the following descriptions that the delay taps for the DQS signals and the DQ signals range from −7 to +8 and the step size is 1 for simplification.

The DQS signals and the DQ signals for which the delay taps are determined and the delay time is adjusted by the delay tap setting units 30b, 30h are output to the transmission lines 40, 50 via the drivers 30d, 30j. The DQS signals are input into the Rank0 memory device 60a or the Rank1 memory device 60b via the transmission line 40, the receiver 60h or the receiver 60j. In addition, the DQ signals are input into the Rank0 memory device 60a or the Rank1 memory device 60b via the transmission line 50 and the receiver 60d or the receiver 60f. The memory devices 60a, 60b write or read the data using the input DQS signals and the input DQ signals according to WRITE commands or READ commands output from the memory controller 20.

When a READ command from the memory controller is input into the memory device 60a, the memory device 60a outputs the DQS signal and the read DQ signal in phase to the transmission lines 40, 50 via the drivers 60g, 60c, respectively. In addition, when a READ command from the memory controller is input into the memory device 60b, the memory device 60b outputs the DQS signal and the read DQ signal in phase to the transmission lines 40, 50 via the drivers 60e, 60i, respectively.

The DQS signals and the DQ signals output from the memory devices 60a, 60b are input into the receivers 30e, 30k of the I/O circuit 30, respectively. The DQS signals output from the receiver 30e are input into the delay tap setting unit 30c. The receiver 30k is connected with the voltage-dividing circuit 30n. The voltage-dividing circuit 30n sets a resistance according to the control by the reference voltage setting unit 30m. And the reference voltage is adjusted based on the resistance set by the voltage-dividing circuit 30n. The reference voltage is input into the receiver 30k. The receiver 30k includes a comparator (not illustrated) and determines the H levels and the L levels for the input DQ signals based on the reference voltage.

The delay taps for the DQ signals output from the receiver 30k are determined by the delay tap setting unit 30i and the delay time for the DQ signals is adjusted. In the I/O circuit 30, the delay tap setting units 30c, 30i shift the phase differences between the DQS signals and the DQ signals to 90° each other, for example. The DQ signals output from the delay tap setting unit 30i are input into the latch circuit 30f. In addition, The DQS signals output from the delay tap setting unit 30c are input into the latch circuit 30f to latch the data. The latched data is input into the memory controller 20. The memory controller 20 performs phase adjustments the details of which are described below.

Figure 3:
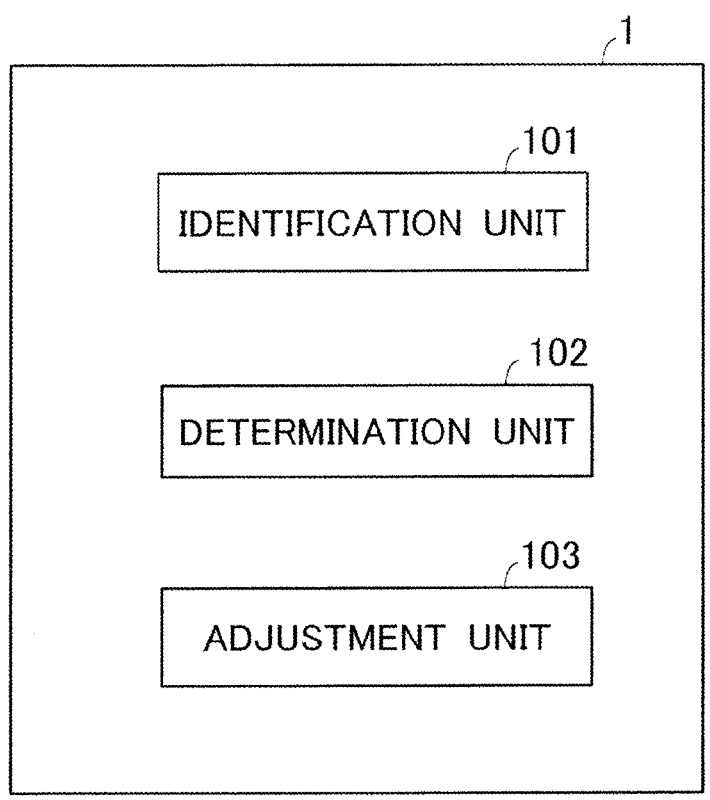
FIG. 3 is a functional block diagram schematically illustrating an information processing apparatus according to an embodiment.

FIG. 3 is a functional block diagram of the information processing apparatus 1 according to the present embodiment. In the present embodiment, applications etc. stored in a Read-Only Memory (ROM; not illustrated) of the information processing apparatus 1 are executed by the CPU 10. However, the applications etc. can be executed by a service processor etc. other than the CPU 10. When such applications are executed, the information processing apparatus 1 functions as an identification unit 101, a determination unit 102 and an adjustment unit 103.

The identification unit 101 identifies at least one phase difference between the DQS signals and the DQ signals for successfully acquiring the DQ signals by using the DQS signals. The identification unit 101 identifies the phase differences for each candidate value of reference voltages used for determining the H levels and the L levels of the DQ signals. The determination unit 102 determines a value of reference voltage with which the period for successfully acquiring the DQ signals is estimated to be the longest of the periods therefor based on the identified phase differences for each candidate value of reference voltages. Further, the adjustment unit 103 adjusts the phase relations between the DQ signals and the DQS signals based on the period for the determined reference voltage.

Figure 4:
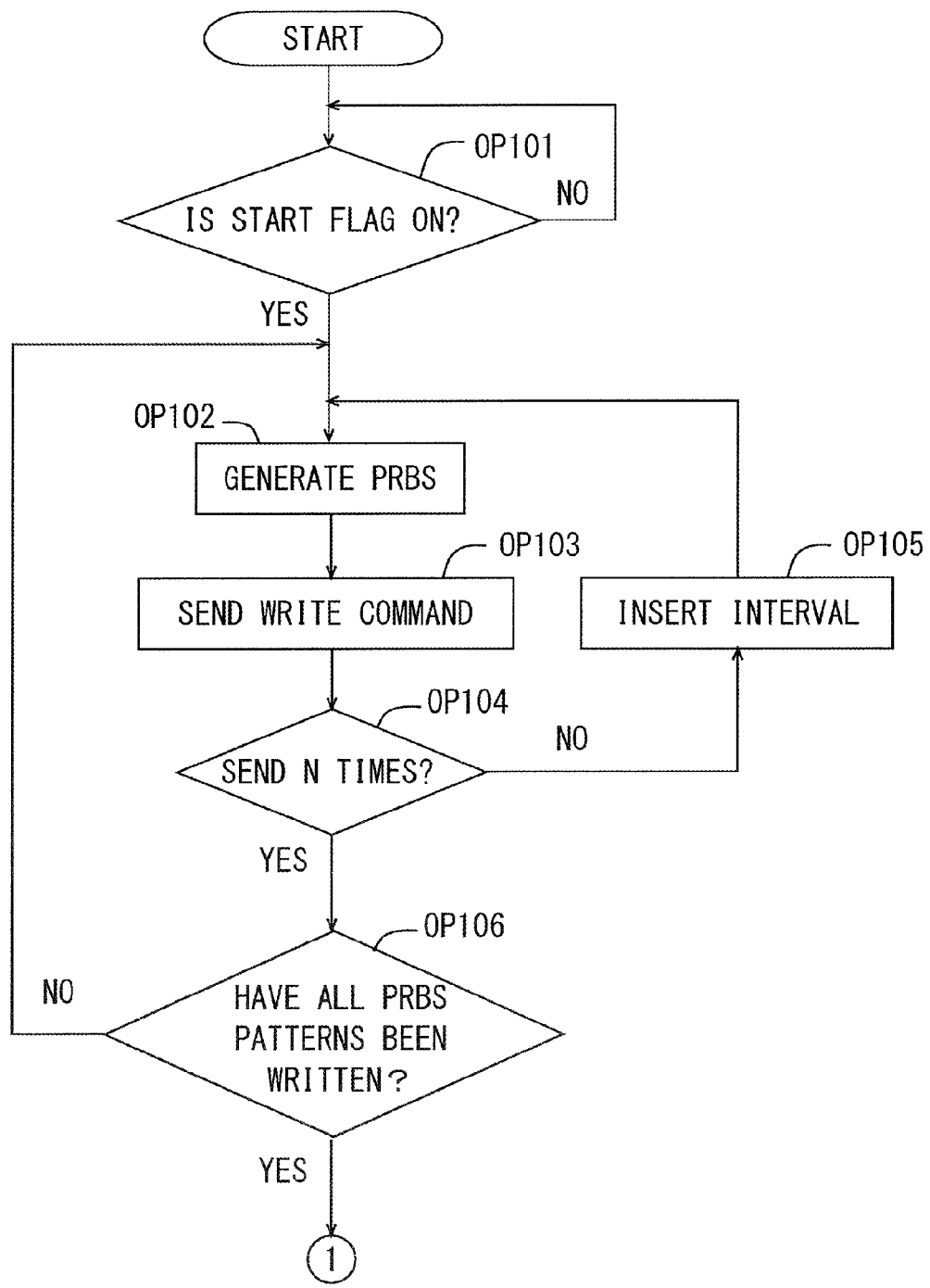
FIG. 4 is a flowchart of processes performed by an information processing apparatus according to an embodiment.

Next, the processes performed by the control of the CPU 10 in the information processing apparatus 1 according to the present embodiment are described below. The CPU 10 initiates the processes in the flowchart as illustrated in FIG. 4 when the information processing apparatus 1 is powered on. It is noted that "1" indicated in FIG. 4 is connected with "1" indicated in FIG. 5.

In OP 101, the memory controller 20 determines whether the start flag 20*d* of the PRBS generation unit 20*b* is set to ON. When the start flag 20*d* is set to ON (OP101: Yes), the process proceeds to OP102. When the start flag 20 is set to OFF (OP101: No), the memory controller repeats the process in OP101.

In OP102, the memory controller 20 controls the PRBS generation unit 20*b* to generate a PRBS random pattern. In the present embodiment, a PRBS random pattern is divided by a predetermined number of bits and written into the memory devices 60*a*, 60*b*. For example, a 128 bit PRBS random pattern is divided by 8 bits, and each divided random pattern is subject to a writing process according to a WRITE command. Therefore, in OP102, the number of bits of the generated random patterns is determined by the division unit, that is 8 bits in the above example. Next, the process proceeds to OP103. In OP103, the memory controller 20 generates a WRITE command for writing the data signal generated by the PRBS generation unit 20*b* to the memory devices 60*a*, 60*b* of the memory module 60.

The WRITE command generated by the I/O circuit 30 is input into the memory device 60*a* or 60*b* which is the destination of the DQS signal and the DQ signal via the transmission lines 40, 50 which connect the I/O circuit 30 with the memory module 60. Next, the process proceeds to OP104.

In OP104, the memory controller 20 determines whether the WRITE commands are transmitted N times (N is natural number) from the I/O circuit 30 to the memory module 60. It is noted that N is the number of divisions of the PRBS random pattern. For example, when a 128 bit PRBS random pattern is divided by 8 bits, the following formula is obtained: N=128/8=16. The memory controller 20 can use a counter (not illustrated) in the information processing apparatus 1 to calculate the number of times in which the WRITE commands are transmitted to the memory module 60. When the WRITE commands are transmitted N times from the I/O circuit 30 to the memory module 60 (OP104: Yes), the process proceeds to OP106. When the number of times in which the WRITE commands are transmitted from the I/O circuit 30 to the memory module 60 is less than N (OP104: No), the process proceeds to OP105.

In OP105, the memory controller 20 provides a predetermined interval for the transmission of the PRBS random pattern and the WRITE command. As illustrated in FIG. 4, the PRBS random patterns and the WRITE commands are transmitted to the memory module 60 N times. Since a PRBS random pattern and a WRITE command which are subsequent to another PRBS random pattern and a WIRTE command are transmitted to the memory module 60 after the interval provided in OP105, it is expected that the PRBS random pattern is more reliably written into the memory module 60 than the case in which the interval is not provided for the transmission of the PRBS random pattern and the WRITE command. After the memory controller 20 provides the predetermined interval in OP105, the process returns to OP102. Since the CPU 10 repeats the processes from OP102 to OP105, the CPU 10 sequentially generates divided PRBS random patterns and performs the processes of writing the PRBS random patterns to the memory devices 60*a*, 60*b*.

In OP106, the memory controller 20 determines whether the writing of all the PRBS random patterns to the memory devices 60*a*, 60*b* has been performed. For example, the writing of a 128 bit PRBS random pattern is performed for every combination of "0" and "1" of the 128 bit in the present embodiment. When the writing of all the PRBS random patterns to the memory devices 60*a*, 60*b* has been performed (OP106: Yes), the process proceeds to OP107 in FIG. 5. When the writing of all the PRBS random patterns to the memory devices 60*a*, 60*b* has not been finished (OP106: No), the process returns to OP102 and the memory controller 20 performs the writing of the remaining PRBS random patterns of which the writing has not been performed. Specifically, the PRBS generation unit 20*b* of the memory controller 20 can be configured to perform the process in OP106.

In OP107, the memory controller 20 sets the reference voltage and the delay tap for each DQ signal and the delay tap for the DQS signal based on the setting values for the registers as illustrated in FIG. 2 which are stored in the data acquisition determination register 20*e*. And the memory controller 20 generates READ commands for reading the PRBS random patterns written to the memory module 60. The generated READ commands is output from the I/O circuit 30 and input into the memory device 60*a* or 60*b* via the transmission line (not illustrated) which connects the I/O circuit 30 with the memory module 60. When the memory device 60*a* or 60*b* receives a READ commend, the memory device 60*a* or 60*b* reads the stored data according to the READ command and outputs the data as a DQ signal with a DQS signal which is in phase with the DQ signal to the I/O circuit 30. The I/O circuit 30 receives the data output from the memory module 60. And then the process proceeds to OP108.

In OP108, the data acquisition determination unit 20*c* of the memory controller 20 determines whether the PRBS random patterns read from the memory devices 60*a*, 60*b* using READ commands in OP106 matches with the PRBS random patterns generated in OP102.

In the present embodiment, the initial values for delay taps set by the delay tap setting units 30*b*, 30*c*, 30*h*, 30*i* are "0". And the delay tap setting units 30*b*, 30*c*, 30*h*, 30*i* set the delay taps to one of taps from 0 to 31 which are determined according to the divided widths as described above. That is, each phase of the DQS signal and the DQ signal can individually be shifted to the side on which the phase is delayed from the initial position. In addition, each phase of the DQS signal and the DQ signal cannot be individually shifted to the side on which the phase is advanced from the initial position. However, when the phase of the DQS signal is fixed and the phase of the DQ signal is delayed, the phase of the DQS signal can substantially be advanced with reference to the phase of the DQ signal.

In FIG. 6, the left side of the boundary which is "0" of the "DOS delay tap" is referred to as setup side, that is the side on which the phase of the DQ signal is advanced with reference to the phase at the edge of the DQS signal. Since the phase of the DQS signal itself cannot be advanced in the present embodiment, the delay tap for the DQS signal is shifted to the setup side by delaying the phase of the DQ signal. Therefore, the results of the data acquisition determinations on the setup side can be retrieved. In a similar manner, the right side of the boundary which is "0" of the "DQS delay tap" is referred to as hold side, that is the side on which the phase of the DQ signal is delayed with reference to the phase at the edge of the DQS signal. Since the phase of the DQ signal itself cannot be advanced in the present embodiment, the delay tap for the DQS signal is shifted to the hold side by delaying the phase of the DQS signal. Therefore, the results of the data acquisition determinations on the hold side can be retrieved. Thus, the phases of the DQ signal and the DQS signal are relatively shifted to retrieve the results of the data acquisition determinations.

In OP108, the data acquisition determination unit 20c performs the processes from OP102 to OP106 to determine whether each PRBS random pattern read from the memory devices 60a or 60b matches with the corresponding PRBS random pattern written into the memory devices 60a or 60b. The data acquisition determination unit 20c determines that the data reading with the set reference voltage for the DQ signal and the set delay tap for the DQS signal is successful when each read PRBS random pattern matches with the corresponding PRBS random pattern written into the memory devices 60a or 60b. In addition, the data acquisition determination unit 20c determines that the data reading with the set reference voltage for the DQ signal and the set delay tap for the DQS signal is failed when at least one of the read PRBS random patterns does not match with the corresponding PRBS random pattern written into the memory devices 60a or 60b. Next, the process proceeds to OP109.

In OP109, the memory controller 20 stores the determination result in OP108 in the read result display register of the data acquisition determination register 20e. In the present embodiment, the memory controller 20 stores ○ (circle) when the determination result in OP108 means that the data reading is successful and the memory controller 20 stores x (ex) when the determination result in OP108 means that the data reading is failed. Next, the process proceeds to OP110. In OP110, the memory controller 20 determines whether the determination process in OP108 has been performed for each combination of the reference voltage for the DQ signal and the delay tap for the DOS signal. When the determination process in OP108 has not been performed for at least one of the combinations of the reference voltages for the DQ signal and the delay taps for the DOS signal (OP110: No), the process returns to OP107. On the other hand, when the determination process in OP108 has not been performed for each combination of the reference voltage for the DQ signal and the delay tap for the DOS signal (OP110: Yes), the process proceeds to OP111.

FIG. 6 illustrates an example of the determination results stored in the data acquisition determination register 20e after the processes from OP107 to OP110 have been finished. FIG. 6 illustrates the results of the data acquisition determinations for each DQ signal from DQ0 to DQ3 by using the reference voltages for the DQ signals from Vref0 to Vref7 and the delay taps for the DOS signals from −7 to 8. In FIG. 6, ○ (circle) means that each PRBS random pattern read from the memory module 60 matches with the corresponding PRBS random pattern generated in OP102. In addition, x (ex) means that at least one of the PRBS random patterns read from the memory module 60 does not match with the corresponding PRBS random pattern generated in OP102.

In OP111, the process control is returns to the CPU 10. In the present embodiment, the CPU 10 performs the processes OP111 and OP112 based on the determination results as illustrated in FIG. 6. Namely, the CPU 10 determines in OP111 a reference voltage which is referred to as optimum Vref at which it is estimated that the period during which the data signals can be acquired successfully for each DQ signal is the longest. The CPU 10 adjusts in OP112 the phase of the DQ signal and the phase of the DQS signal based on the determination results for the optimum Vref for each DQ signal.

Figure 7:
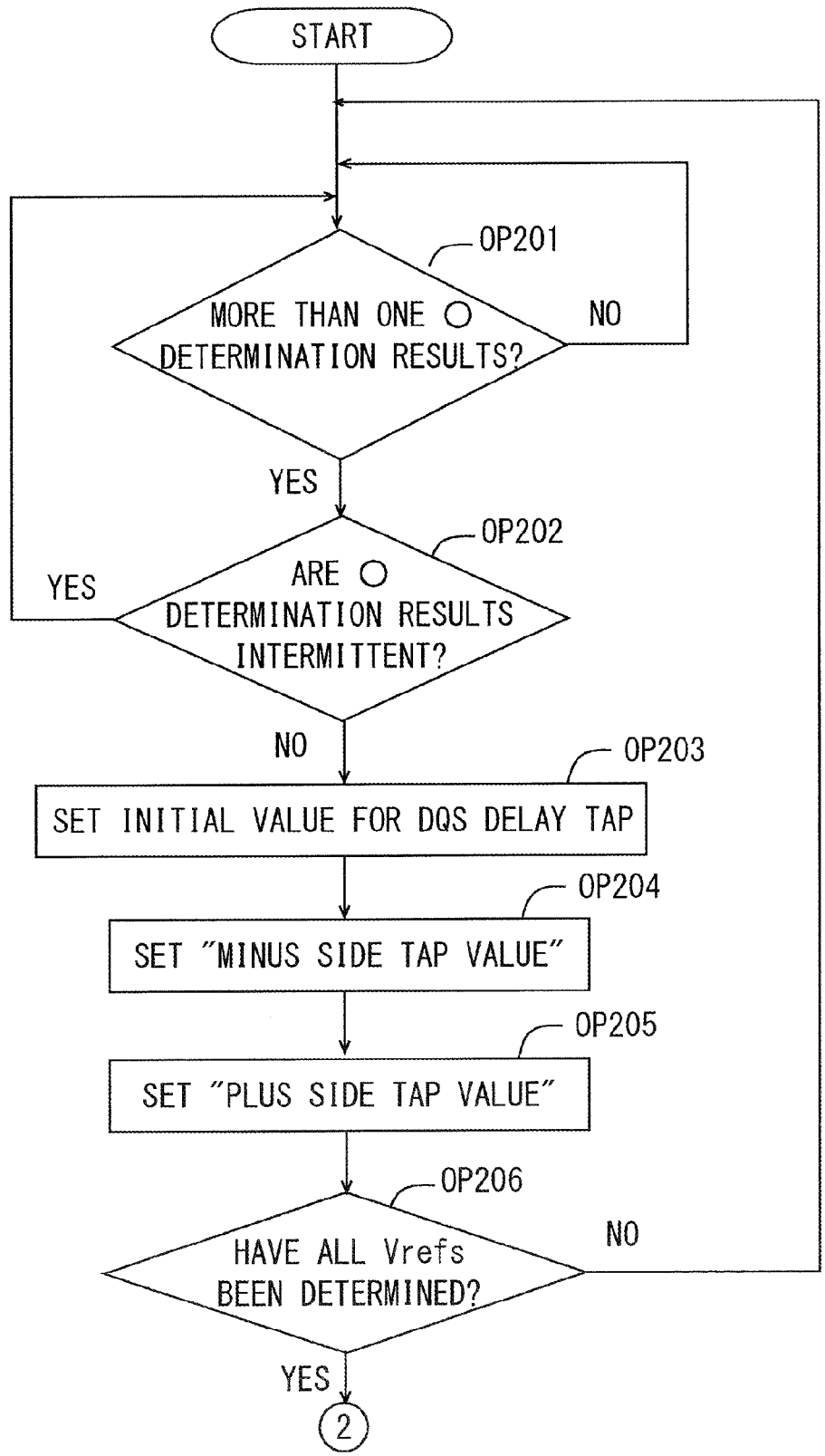
FIG. 7 is a flowchart of processes performed by an information processing apparatus according to an embodiment.
Figure 8:
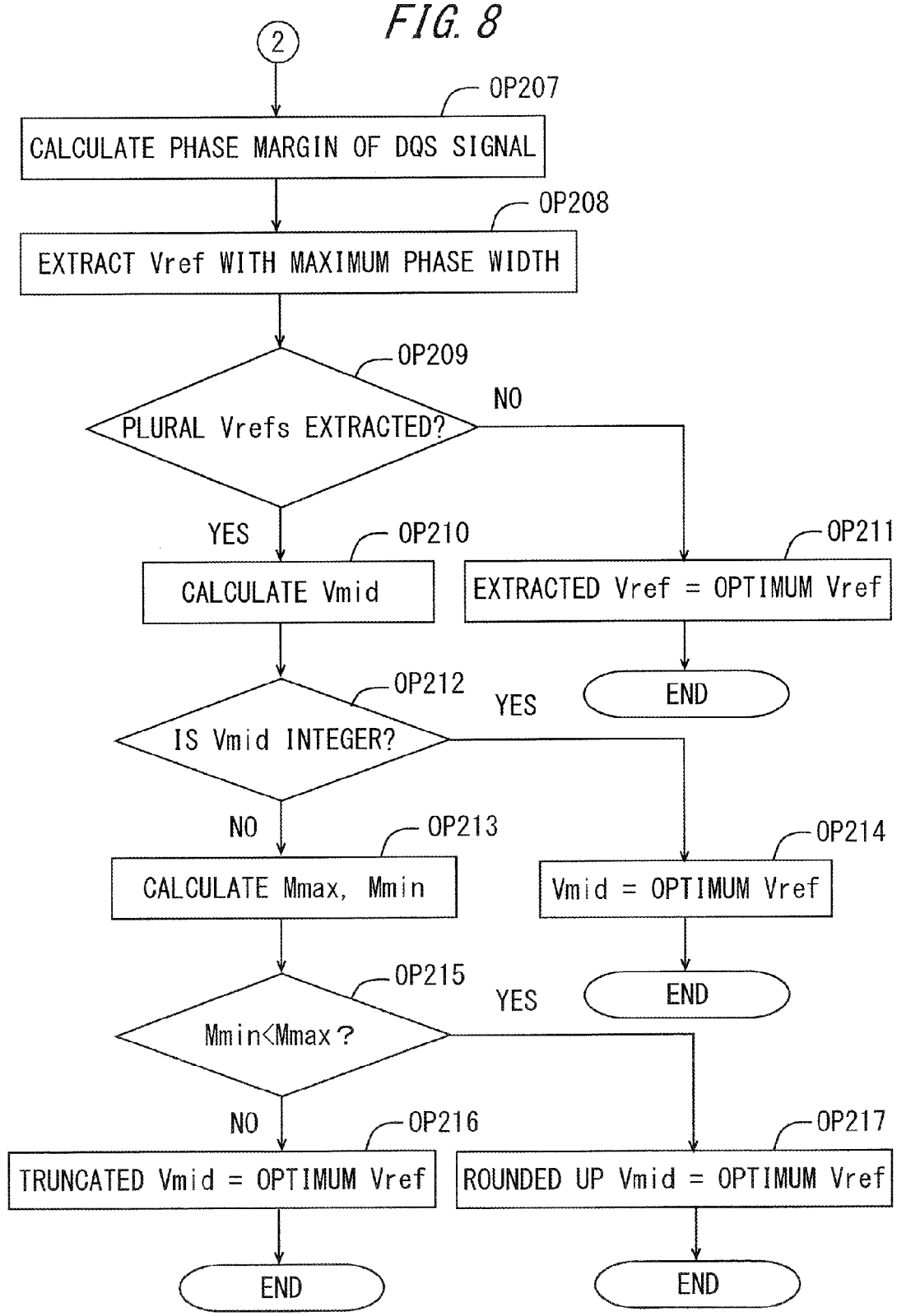
FIG. 8 is a flowchart of processes performed by an information processing apparatus according to an embodiment.

FIGS. 7 and 8 illustrate flowcharts of processes performed in OP111. It is noted that "2" in FIG. 7 is connected with "2" in FIG. 8. In OP201, the CPU 10 selects one Vref for one of the DQ signals from DQ0 to DQ3 as a target Vref and determines whether there is at least one ○ (circle) determination result between the delay taps −7 and 8 for the DQS signal with reference to the target Vref. When there is at least one ○ (circle) determination result between the delay taps −7 and 8 with reference to the target Vref, the process proceeds to OP202. In addition, when there is no ○ (circle) determination result between the delay taps −7 and 8 with reference to the target Vref, the CPU 10 repeats the process OP201.

In OP202, the CPU 10 determines whether ○ (circle) determination results are not continuous for the target Vref. When ○ (circle) determination results are intermittent (OP202:Yes), the CPU returns the process to OP201 and performs the process OP201 for another target Vref. On the other hand, when ○ (circle) determination results are not intermittent (OP202: No), the process proceeds to OP203.

Referring to FIG. 6, for example, ○ (circle) determination results divided into the delay taps from −2 to 0 and from 2 to 3 for the DQS signal with reference to the Vref 2 for the DQ signal DQ1. In this case, the CPU determines in OP201 that there is at least one ○ (circle) determination result and the process proceeds to OP202. In addition, the CPU 10 determines in OP202 that ○ (circle) determination results are intermittent since the ○ (circle) determination results are divided into the delay taps from −2 to 0 and 2 to 3 for DQS signal, and the CPU 10 returns the process to OP201.

In OP203, the CPU 10 sets an initial value for the delay tap for the DQS signal in order to check the data acquisition determination results for each delay tap for the DQS signal with reference to the target Vref. In the present embodiment, the CPU 10 increments the delay tap by one delay tap from the set initial value and checks the data acquisition determination result for each incremented delay tap. In the example in FIG. 6, the CPU 10 sets the initial value of the delay tap for the DQS signal to −7, that is sets the initial value of the DQ signal delay tap to +7. Next, the process proceeds to OP204.

In OP204, the CPU 10 increments the delay tap by on delay tap from the initial value set in OP203 and determines that the first delay tap for which the determination result becomes ○ (circle) as "minus (−) side tap value". Next, the process proceeds to OP205. In OP205, the CPU 10 increments the delay tap for the DQS signal by one delay tap and determines that the delay tap prior to the delay tap for which the determination result changes from ○ (circle) to x (ex) as "plus (+) side tap value". Next, the process proceeds to OP206.

In the example in FIG. 6, the CPU 10 determines in OP204 that the "minus side tap value" for Vref3 for the DQ signal DQ0 is "−3" and the CPU 10 determines in OP205 that the "plus side tap value" for Vref3 for the DQ signal DQ0 is "5".

In OP206, the CPU 10 determines whether the determination processes in OP201 and OP202 have been performed for each Vref for each DQ signal. When the determination processes in OP201 and OP202 have been performed for each Vref for each DQ signal (OP206: Yes), the process proceeds to OP207 in FIG. 8. In addition, when the determination processes in OP201 and OP202 have not been performed for at least one Vref for at least one DQ signal (OP206: No), the CPU 10 returns the process to OP201.

In OP207, the CPU 10 calculates the consecutive numbers of the ○ (circle) determination results for each Vref for each DQ signal obtained by the processes in OP204 and OP205 based on the values for the "minus side tap value" and the "plus side tap value" determined by the processes in OP204 and OP205. In the present embodiment, the consecutive numbers of the ○ (circle) determination results for each Vref for each DQ signal calculated in OP207 are referred to as a phase margin for DQS signal delay tap. In the example in FIG. 6, the phase margin for DQS signal delay tap for Vref3 for the DQ signal DQ0 is calculated to be "9", for example. In OP207, the CPU calculates the phase margin for DQS signal delay tap for each Vref for each DQ signal. Next, the process proceeds to OP208.

In OP208, the CPU 10 determines a Vref for each DQ signal for which the value of the phase margin for DQS signal delay tap is a maximum value based on the data acquisition determination result for each DQ signal from DQ0 to DQ3. And the CPU 10 extracts the data acquisition determination results for the determined Vref for each DQ signal. In the example in FIG. 6, since the values for the phase margins for DQS signal delay tap for Vrefs from Vref2 to Vref4 regarding the DQ signal DQ0 are "9", the data acquisition determination results for these three Vrefs from Vref2 to Vref4 are extracted. Similarly, the data acquisition determination results for Vref3 and Vref4 for the DQ signal DQ1, the data acquisition determination results for Vref3 for the DQ signal DQ2 and the data acquisition determination results for Vref3 for the DQ signal DQ03 are extracted. Next, the process proceeds to OP209.

In OP209, the CPU 10 determines for each DQ signal whether the data acquisition determination results are extracted for a plurality of Vrefs in OP208. The process proceeds to OP210 for the DQ signal for which the data acquisition determination results are extracted for a plurality of Vrefs (OP209: Yes). On the other hand, the process proceeds to OP211 for the DQ signal for which the data acquisition determination results are extracted for a single Vref (OP209: No).

In OP211, the CPU 10 determines a Vref among the Vrefs for which the data acquisition determination results are extracted in OP208 as optimum Vref. It is noted here that the optimum Vref corresponds to an example of a reference value for which the period for successfully acquiring a data signal is the longest. In the example in FIG. 6, the data acquisition determination results for Vref3 alone are extracted for the DQ signal DQ2 and the DQ signal DQ3 in OP208. Therefore, the CPU 10 determines in OP209 and OP211 that Vref3 is the optimum Vref for the DQ signal DQ2 and the DQ signal DQ3.

In OP210, the CPU 10 uses the following the formula (1) to calculate Vmid.

$$Vmid=(Vmin+Vmax)/2 \quad (1)$$

It is noted here that Vmin is the minimum value of Vref among the plurality of Vrefs extracted in OP208. It is noted here that Vmax is the maximum value of Vref among the plurality of Vrefs extracted in OP208. In the example in FIG. 6, since the minimum value of Vref for the DQ signal DQ0 is Vref2, the value of Vmin is "2". And since the maximum value of Vref for the DQ signal DQ0 is Vref4, the value of Vmax is "4". Therefore, the value of Vmid is calculated from the formula (1): Vmid=3. Similarly, since the value of Vmin is "3" and the value of Vmax is "4" for the DQ signal DQ1, the value of Vmid is calculated from the formula (1): Vmid=3.5. When the CPU 10 completes the processes OP210, the process proceeds to OP212.

In OP212, the CPU 10 determines whether the calculated value of Vmid is integer for each value of Vmid calculated in OP210. The process proceeds to OP214 for the DQ signal for which the value of Vmid is integer (OP212: Yes). On the other hand, the process proceeds to OP213 for the DQ signal for which the value of Vmid is not integer (OP209: No). In the example in FIG. 6, since the value of Vmid is "3" for the DQ signal DQ0, the process proceeds to OP214. On the other hand, since the value of Vmid is "3.5" for the DQ signal DQ1, the process proceeds to OP213.

In OP214, the CPU 10 determines the value of Vmid calculated in OP210 as an optimum Vref. In the example in FIG. 6, the CPU 10 determines Vref3 as the optimum Vref since the value of Vmid for the DQ signal SQ0 is "3".

In OP213, the CPU 10 calculates Mmax and Mmin based on the data acquisition determination results for each DQ signal. It is noted that Mmax is the maximum value of consecutive numbers of the ○ (circle) determination results for Vref which is one Vref above the Vref corresponding to Vmax calculated in OP210. On the other hand, Mmin is the maximum value of consecutive numbers of the ○ (circle) determination results for Vref which is one Vref above the Vref corresponding to Vmin calculated in OP210.

In the example in FIG. 6, Mmax is "6" since the value of Vmax for the DQ signal DQ1 is "4" and the maximum value of the consecutive numbers of the ○ (circle) determination results for Vref5 which is one Vref above Vref4 which is Vmax is "6". In addition, Mmin is "3" since the value of Vmin for the DQ signal DQ1 is "3" and the maximum value of the consecutive numbers of the ○ (circle) determination results for Vref2 which is one Vref below Vref3 which is Vmin is "3". When the CPU 10 completes the process in OP213, the process proceeds to OP215.

In 215, the CPU 10 determines the magnitude relation between the values of Mmax and Mmin calculated in OP213. When the value of Mmax is larger than the value of Mmin (OP215: Yes), the process proceeds to OP217. On the other hand, when the value Mmax is equal to or smaller than the value of Mmin (OP215: No), the process proceeds to OP216.

In OP216, the CPU 10 determines that a Vref corresponding to a value obtained by truncating the value of Vmid calculated in OP210 is an optimum Vref. In OP217, the CPU 10 determines that a Vref corresponding to a value obtained by rounding up the value of Vmid calculated in OP210 is an optimum Vref. In the calculation example in FIG. 5, the value of Mmax is "6", the value of Mmin is "3" and the value of Vmid is "3.5" for the DQ signal DQ1. Therefore, the process proceeds from OP215 to OP217, and the CPU 10 determines that Vref4 is the optimum Vref since the value obtained by rounding up the value of Vmid is "4".

As illustrated in FIG. 6, there are two Vrefs, that is Vref3 and Vref4, for which the consecutive numbers of the ○ (circle) determination results for the DQ signal DQ1 are maximum. Therefore, the maximum width of the consecutive numbers of the ○ (circle) determination results for Vref2 next to Vref3 and the maximum width of the consecutive numbers of the ○ (circle) determination results for Vref5 next to Vref4 are compared in the present embodiment. And then the Vref for which the maximum width of the consecutive numbers of the ○ (circle) determination results is larger between Vref2 and Vref5 is determined as the optimum Vref. In the example in FIG. 6, Vref4 next to Vref5 is determined as the optimum Vref.

When the CPU 10 determines the optimum Vref for each DQ signal from DQ0 to DQ3 by the processes in OP211, OP214, OP216 and OP217, the CPU completes the processes in the present flowchart and the process proceeds to OP112.

Figure 9:
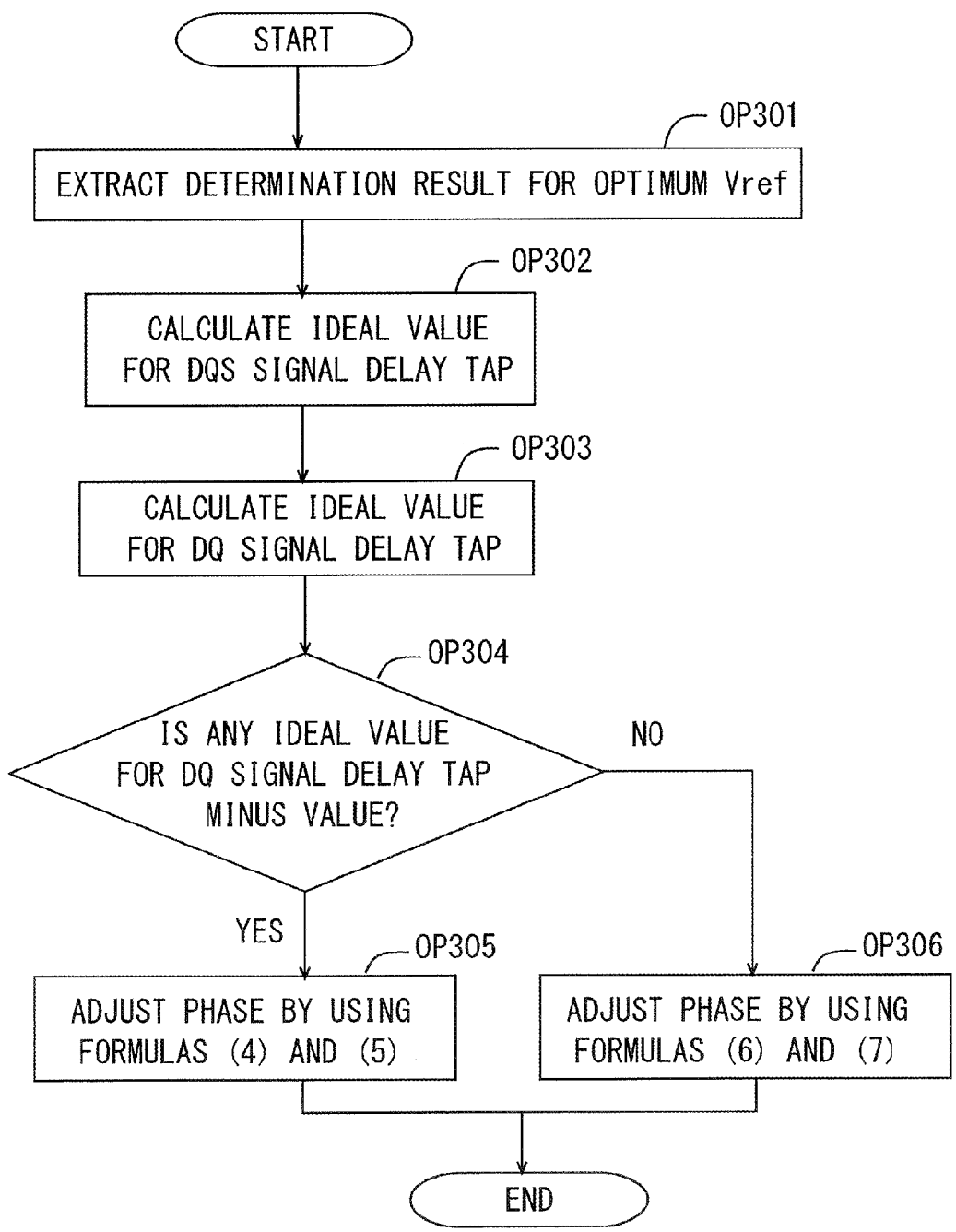
FIG. 9 is a flowchart of processes performed by an information processing apparatus according to an embodiment.
Figure 11:
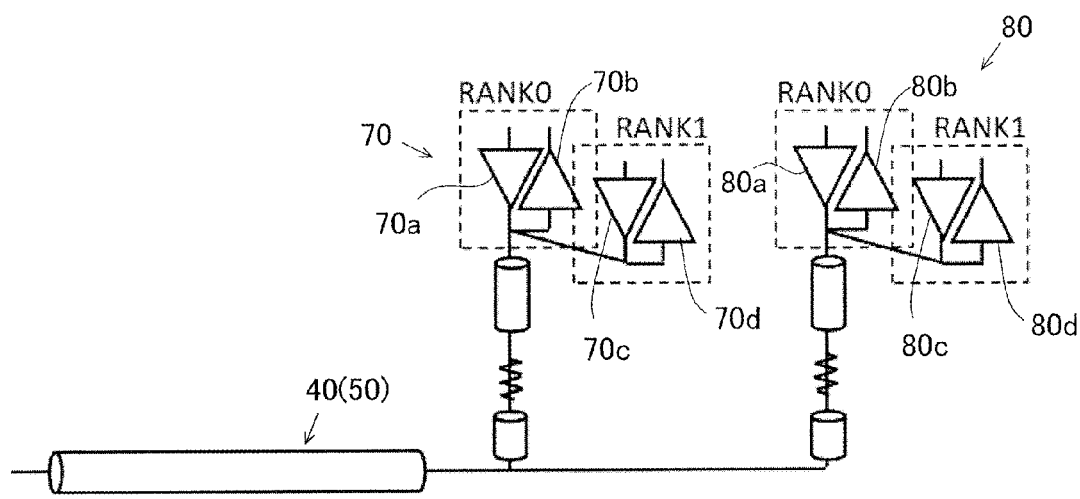
FIG. 11 is a diagram schematically illustrating a memory module according to an embodiment.

FIG. 9 illustrates a flowchart of processes performed by the CPU 10 in OP112. In OP301, the CPU 10 extracts the data acquisition determination results for the optimum Vref for each DQ signal from DQ0 to DQ3 determined in OP111 from the data acquisition determination register 20e. FIG. 10A illustrates an example of the data acquisition determination results extracted by the CPU 10 in OP301. As illustrated in FIG. 10A, the position of the phase margin for DQS signal delay tap for each optimum Vref for each DQ signal from DQ0 to DQ3 differs from each other. In the present embodiment, the CPU 10 uses the data acquisition determination results extracted in OP301 to perform the processes in OP302 to OP307 as described below. As a result, the CPU 10 aligns the DQS signal delay taps for the DQ signals from DQ0 to DQ3.

In OP302, the CPU 10 uses the following formula (2) to calculate an ideal value for each DQS signal delay tap. It is noted that the ideal value for a DQS signal delay tap is a median of the phase width for the DQ signal corresponding to the consecutive ○ (circle) determination results for the optimum Vref for the DQ signal extracted in OP301. That is, the ideal value is an ideal phase of the DQS signal corresponding to the appropriate strobe point for acquiring the data of the DQ signal.

(Ideal value for *DQS* signal delay tap)={(Phase margin on the minus side of *DQ* signal delay tap)+ (Phase margin on the plus side of *DQ* signal delay tap)}/2   (2)

The ideal value for DQS signal delay tap is calculated by rounding up the number after the decimal point in the present embodiment. In addition, it is noted that the phase margin on the minus side of DQ signal delay tap is the phase width corresponding to the consecutive ○ (circle) determination results on the minus side when the reference point is set at the point at which the value of the DQS signal delay tap is "0". And it is noted that the phase margin on the plus side of DQ signal delay tap is the phase width corresponding to the consecutive ○ (circle) determination results on the plus side when the reference point is set at the point at which the value of the DQS signal delay tap is "0".

In the example in FIG. 10A, the ○ (circle) determination results for acquiring DQ signals are successive from −3 to −1 for DQS signal delay tap for the DQ signal DQ0. Therefore, the phase margin on the minus side of the DQ signal delay tap for the successive ○ (circle) determination results is "−3". Similarly, the ○ (circle) determination results for acquiring DQ signals are successive from 1 to 5 for DQS signal delay tap for the DQ signal DQ0. Therefore, the phase margin on the plus side of the DQ signal delay tap for the successive ○ (circle) determination results is "5". As a result, the ideal value for DQS signal delay tap in this case is "1".

The CPU 10 calculates for each DQ signal the phase margins on the minus side and on the plus side of the DQ signal delay tap for successively acquiring the DQ signal. In the example in FIG. 10A, the ideal values for DQS signal delay tap for DQ signals DQ0, DQ1, DQ2 and DQ3 are "1", "2", "−1" and "2", respectively. It is noted that the ○ (circle) determination results corresponding to the ideal values for DQS signal delay tap for each DQ signal are indicated by bold line rectangles.

The ideal values of the DQS signal delay tap for each SQ signal represent optimum strobe points for acquiring DQ signal data for the optimum Vref for each DQ signal. However, as illustrated in FIG. 9A, the ideal value for DQS signal delay tap differs from one DQ signal to another. Therefore, in the present embodiment, the CPU 10 adjusts the phase of each DQ signal and the phase of each DQS signal by performing the following processes in order to achieve that the ideal value for DQS signal delay tap for each DQ signal is "0". When the CPU 10 completes the process in OP302, the process proceeds to OP303.

In OP303, the CPU 10 assigns the ideal values for DQS signal delay tap calculated in OP302 to the following formula (3) to calculate the ideal values for DQ signal delay tap. It is noted that the ideal value for DQ signal delay tap is the phase delay used for shifting each DQ signal to achieve that the center of the phase of each DQ signal is "0".

(Ideal value for *DQ* signal delay tap)=−(Ideal value for *DQS* signal delay tap)   (3)

As illustrated in FIG. 10B, the ideal values for DQS signal delay tap for DQ signals DQ0, DQ1, DQ2 and DQ3 are "−1", "−2", "1" and "−2", respectively. That is, when the phase of the DQS signal is shifted according to the ideal value for DQS signal delay tap, the DQS signal delay tap is set to "0". Therefore, when the phase of the DQ signal is shifted according to the ideal value for DQ signal delay tap, the median of the phase width of the DQ signal for which ○ (circle) determination results are obtained. When the CPU 10 completes the process in OP303, the process proceeds to OP304.

In OP304, the CPU 10 determines whether at least one of the ideal values for DQ signal delay tap calculated in OP303 is a minus value. When at least one of the ideal values for DQ signal delay tap is a minus value (OP304: Yes), the process proceeds to OP305. When the ideal values for DQ signal delay tap are not minus values, that is each ideal value for DQ signal delay tap is a plus value (OP304: No), the process proceeds to OP306.

The reasons why the CPU 10 determines in OP304 whether at least one of the ideal values for DQ signal delay tap is a minus value are described here. FIGS. 10A and 10E illustrate different data acquisition determination results. As described above, when each ideal value for DQ signal delay tap is a plus value as illustrated in FIG. 10E, the DQS signal delay tap for each DQ signal can be aligned by delaying the phase of the DQ signal. It is noted that the phase of each DQ signal is delayed to achieve that the median of the DQS signal delay tap for each DQ signal is "0".

On the other hand, as illustrated in FIG. 10A, the fact that at least one of the ideal values for DQ signal delay tap is a minus value means that an adjustment is required for advancing the phase of the DQ signal for which the ideal value for DQ signal delay tap is a minus value. However, such an adjustment for advancing the phase of the DQ signal cannot be achieved in the present embodiment as described above. Therefore, the DQS signal delay tap is set according to the ideal value for DQ signal delay tap to achieve that the phase of the DQS signal is delayed. In addition, each DQ signal delay tap is set in light of the phase delay of the DQS signal to achieve that the phase of each DQ signal is delayed.

In the present embodiment, the DQS signal delay tap and the DQ signal delay tap can be set to delay the phases of the signals from the initial positions but cannot be set to advance the phases of the signals from the initial positions. Therefore, the phases of the DQS signals and the DQ signals are adjusted by delaying the DQS signal delay taps and the DQ signal delay taps based on the determination whether at least one of the ideal values for DQ signal delay tap is a minus value.

In OP305, the CPU 10 uses the following formula (4) to determine reference values for the phases of the DQS signals.

(Reference value for phase of $DQS$ signal)=−(Minimum value among ideal values for $DQ$ signal delay tap)     (4)

It is noted that the "minimum value among ideal values for DQ signal delay tap" is the minimum value among the ideal values for DQ signal delay tap calculated for each DQ signal by using the formula (3). It can be concluded from the formulas (2) to (4) that the strobe point of the DQS signal for each DQ signal is shifted according to the maximum value among the ideal values for DQS signal delay tap calculated by using the formula (2).

In OP305, the CPU 10 uses the following formula (5) for each DQ signal to determine the phase shift amount.

(Phase shift amount of $DQ$ signal)=(Ideal value for $DQ$ signal delay tap)+(Reference value for phase of $DQS$ signal)     (5)

It is noted that the "ideal value for DQ signal delay tap" is the ideal value for DQ signal delay tap calculated for each DQ signal by using the formula (3). In addition, the "reference value for phase of DQS signal" is the reference value for the phase of the DQS signal calculated by using the formula (4). It is also noted that the reference value for the phase of the DQS signal is an example of a predetermined target value of the phase.

In OP305, the CPU 10 shifts the phase of the DQS signal according to the reference value for the phase of the DQS signal calculated by using the formula (4). In the example in FIG. 10A, the positions of the DQS signal delay taps for the DQ signals DQ0, DQ1, DQ2 and DQ3, which are ideal strobe points, are "1", "2", "−1" and "2", respectively. When the process in OP305 is performed, the positions of the DQS signal delay taps shifted to "2" as illustrated in FIG. 10C. Therefore, the adjustment of the phase of the DQS signal is achieved by calculating the reference value of the phase of the DQS signal in the present embodiment.

It is noted that the reference value of the phase of the DQS signal is not necessarily calculated by using the formula (4). Instead, the reference value can be a value which is determined on a majority vote among the ideal values for DQS signal delay tap for each DQ signal. Alternatively, the reference value can be the ideal value for DQS signal delay tap for the DQ signal with which the shift amount of the phase of the DQ signal for each DQ signal is the largest.

In addition, the CPU 10 shifts the phase of each DQ signal according to the shift amount of the phase of the DQ signal calculated by using the formula (5). In the example in FIG. 10B, the position of the DQS signal delay tap as the ideal strobe point for the DQ signal DQ0 is "1". Further, the shift amount of the phase of the DQ signal DQ0 calculated by using the formula (5) is "1". Therefore, the phase of the DQ signal DQ0 is shifted to achieve that the position of the DQS signal delay tap for the DQ signal DQ0 is "2". And in the example in FIG. 10B, the position of the DQS signal delay tap as the ideal strobe point for the DQ signal DQ2 is "−1". And the shift amount of the phase of the DQ signal DQ2 calculated by using the formula (5) is "3". As a result, the phase of the DQ signal DQ2 is also shifted to achieve that the position of the DQS signal delay tap is "2".

It is noted that in the example in FIG. 10C, the position of the DQS signal delay tap which is the ideal strobe point for each DQ signal is "2". In addition, the shift amount of the phases of the DQ signals DQ1 and DQ3 calculated by using the formula (5) is "0". Therefore, the phases of the DQ signals DQ1 and DQ3 are not shifted and the position of the DQS signal delay tap for the DQ signals DQ1 and DQ3 remains to be "0".

In OP306, the CPU 10 sets the reference value of the phase of the DQS signal to "0". In addition, the CPU 10 uses the following formula (6) for each DQ signal to determine the shift amount of the phase of the DQ signal.

(Shift amount of phase of $DQ$ signal)=(Ideal value of $DQ$ signal delay tap)     (6)

It is noted here that the "ideal value of DQ signal delay tap" means an ideal value of the DQ signal delay tap for each DQ signal calculated by using the formula (3).

FIGS. 10E and 10F illustrate cases in which the ideal values of the DQ signal delay taps are not minus values in OP304. As understood from the formula (3), the fact that the ideal values of the DQ signal delay taps are not minus values means that each ideal value of the DQS signal delay tap calculated by using the formula (2) is a minus value. Therefore, the process proceeds from OP304 to OP306 in the example in FIG. 10E.

In OP306, the CPU 10 does not shift any phases of the DQS signals. And the CPU 10 shifts the phase of each DQ signal according to the shift amount calculated by using the formula (6). In the example in FIG. 10E, the position of the DQS signal delay tap as the ideal strobe point for the DQ signal DQ0 is "−2". And the shift amount of the phase of the DQ signal DQ0 calculated by using the formula (5) is "2". Therefore, the phase of the DQ signal DQ0 is shifted to achieve that the position of the DQS signal delay tap for the DQ signal DQ0 is "0". Similarly, the positions of the DQS signal delay taps for the DQ signals DQ1, DQ2 and DQ3 are "−1", "−3" and "−1", respectively. It is noted in FIG. 10E that the ○ (circle) determination results corresponding to the ideal values for DQS signal delay tap for each DQ signal are indicated by bold line rectangles. In addition, the shift amounts of the phases of the DQ signals DQ1, DQ2 and DQ3 calculated by using the formula (5) are "1", "3" and "1", respectively. As a result, the phases of the DQ signals DQ1, DQ2 and DQ3 are also shifted to achieve that the positions of the DQS signal delay taps for the DQ signals DQ1, DQ2 and DQ3 are "0".

Figure 5:
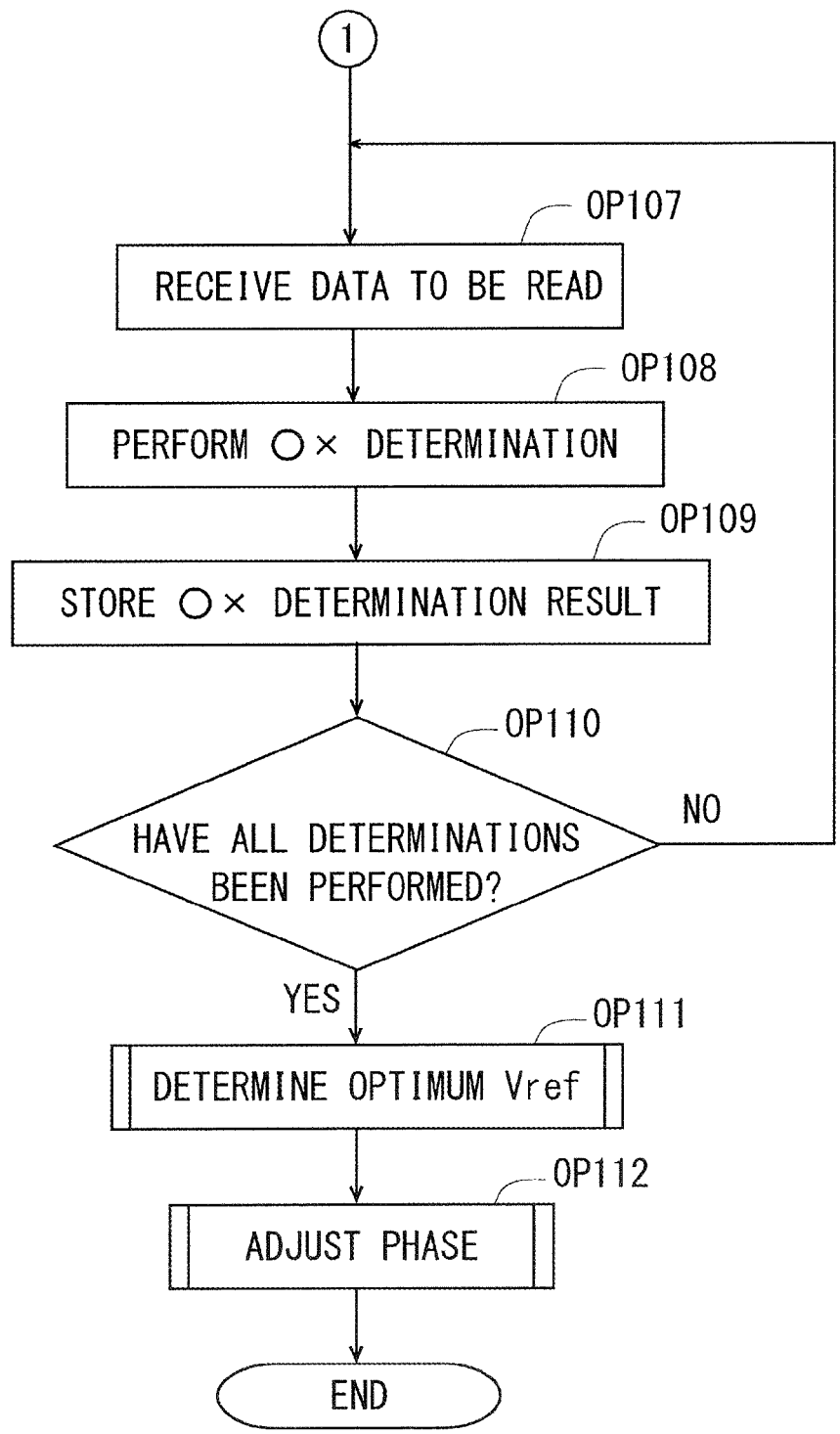
FIG. 5 is a flowchart of processes performed by an information processing apparatus according to an embodiment.

FIG. 10F illustrates a state in which the phases of the DQS signals and the DQ signals as illustrated in FIG. 10E are adjusted by the processes as described above. In the state as illustrated in FIG. 10F, the positions of the ideal strobe points of the DQS signals for the DQ signals DQ0, DQ1, DQ2 and DQ3 are "−2", "−1", "−3" and "−1", respectively. And the phase of each DQ signal is adjusted to achieve that the ideal strobe point of the DQS signal for each DQ signal is "0". When the CPU 10 completes the processes in OP305 and OP306, the CPU completes the processes in OP111 and also completes the processes as illustrated in FIGS. 4 and 5.

As described above, when the processes are performed in the present embodiment, the phases of the DQS signals and the DQ signals can be adjusted to achieve the optimum strobe point for each DQ signal even when different strobe points for optimum Vrefs are initially set for the DQ signals.

Second Embodiment

Next, the second embodiment is described with reference to the drawings. It is noted that the elements and the processes corresponding to the elements and the processes in the first embodiment are attached with the same signs of the elements and the processes in the first embodiment and the detailed descriptions are omitted here. As illustrated in FIG. 1, the memory module 60 includes a Rank0 memory device 60a and a Rank1 memory device 60b. Therefore, in the present embodiment, the data acquisition determination results are calculated for each Rank of the memory module 60.

In the present embodiment, the memory controller 20 performs the processes in OP102 to OP110 in FIGS. 4 and 5 for the Rank0 memory device 60a and the Rank1 memory device 60b of the memory module 60. And the data acquisition determination unit 20c of the PRBS generation unit 20b calculates the data acquisition determination results for each DQ signal regarding each memory device 60a and 60b.

Figure 12:
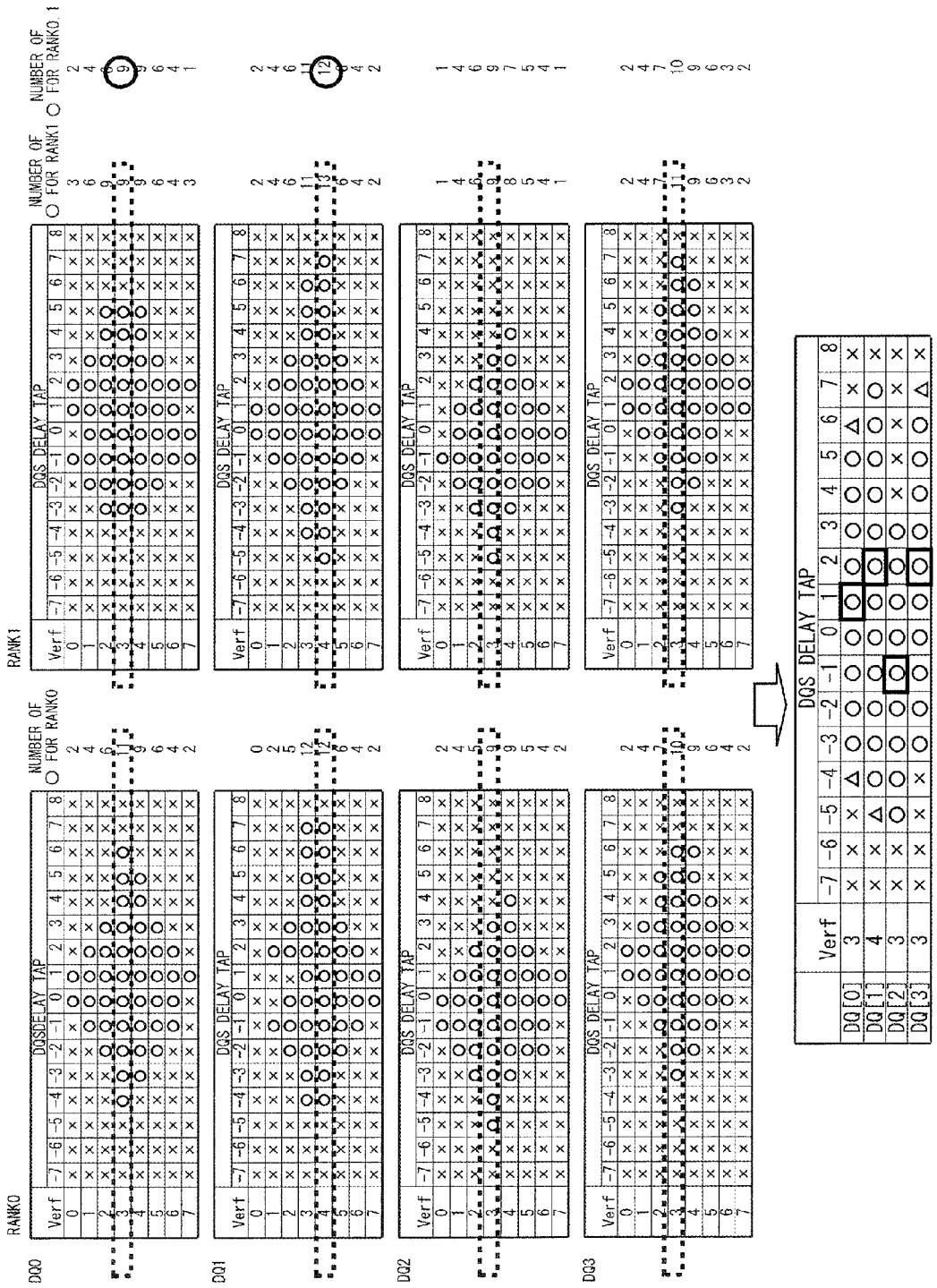
FIG. 12 is a diagram illustrating an example of data acquisition determination results according to an embodiment.
Figure 13:
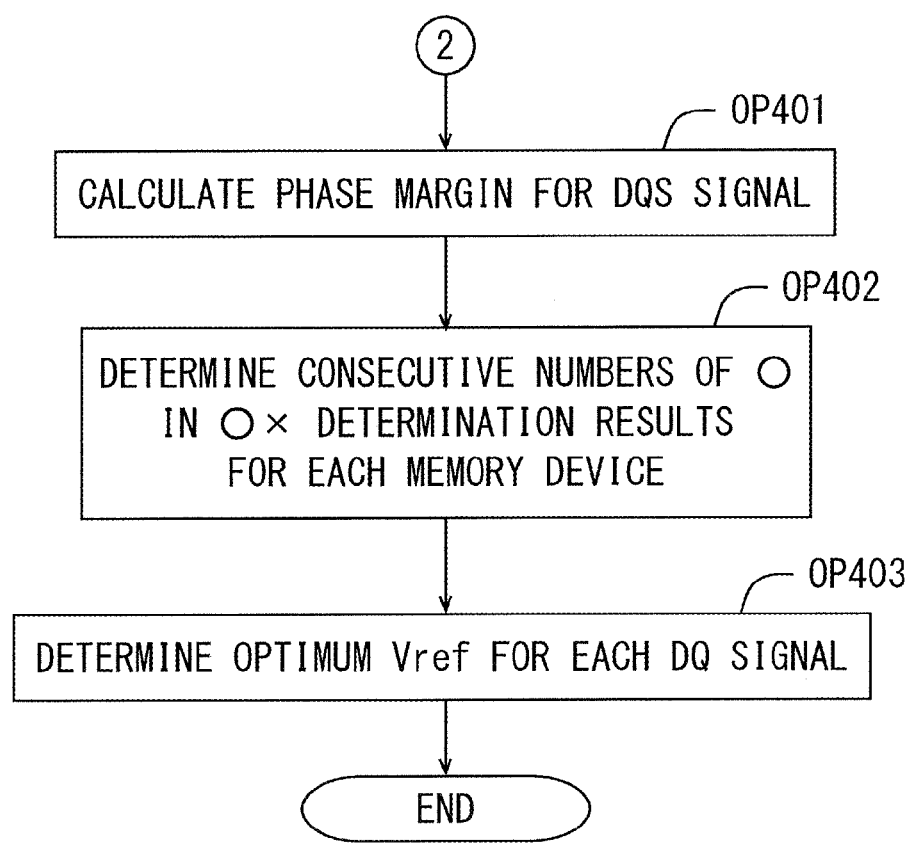
FIG. 13 is a flowchart of processes performed by an information processing apparatus according to an embodiment.

In addition, the CPU 10 performs in the present embodiment the processes in the flowchart as illustrated in FIG. 13 instead of performing the processes in the flowchart as illustrated in FIG. 8 when the CPU 10 performs the processes in OP111 as illustrated in FIG. 5. Therefore, when the Vref determination processes are completed for each data acquisition determination result for each memory device 60a and 60b, the process proceeds to OP401. FIG. 12 illustrates examples of data acquisition determination results for the memory devices 60a and 60b calculated by the data acquisition determination unit 20c. The data acquisition determination results are stored in the data acquisition determination register 20e of the PRBS generation unit 20b.

In OP401, the CPU 10 calculates the consecutive numbers of the ○ (circle) determination results for each Vref for each DQ signal obtained by the processes in OP204 and OP205 based on the values for the "minus side tap value" and the "plus side tap value" determined by the processes in OP204 and OP205.

The CPU 10 determines the optimum Vref for each DQ signal based on the data acquisition determination results for the memory devices 60a and 60b stored in the data acquisition determination register 20e. In the example in FIG. 12, "the number of ○ (circles) for Rank0" indicates the consecutive numbers of the ○ (circle) determination results for each Vref for each DQ signal regarding the memory device 60a. Similarly, "the number of ○ (circles) for Rank1" indicates the consecutive numbers of the ○ (circle) determination results for each Vref for each DQ signal regarding the memory device 60b. When the CPU 10 completes the process in OP401, the process proceeds to OP402.

In OP402, the CPU 10 compares the consecutive numbers of the ○ (circle) determination results for each Vref for each DQ signal between the memory device 60a and the memory device 60b to determine the less number of the consecutive numbers for each Vref for each DQ signal. In FIG. 12, the consecutive numbers determined in OP402 are referred to as "the number of ○ (circles) for Rank0 and Rank1". Next, the process proceeds to OP403.

In OP403, the CPU 10 determines the largest number of the consecutive numbers of ○ (circles) for each DQ signal among the consecutive numbers determined in OP402 as the optimum Vref for each DQ signal. In the example in FIG. 12, Vref3, Vref4, Vref3 and Vref3 are determined as the optimum Vrefs for DQ signals DQ0, DQ1, DQ2 and DQ3, respectively. When the CPU 10 determines the optimum Vref for each DQ signal, the CPU 10 completes the processes in the flowchart in FIG. 13 and the process proceeds to OP111.

In the present embodiment, the CPU 10 extracts the data acquisition determination results for the optimum Vrefs determined in OP403 regarding the memory devices 60a and 60b in OP301 in FIG. 9. In addition, the CPU 10 merges the extracted data acquisition determination results for each DQ signal. In the example in FIG. 12, the data acquisition determination results for Vref3 regarding the memory devices 60a and 60b are extracted for the DQ signal DQ0. And the CPU 10 merges the extracted data acquisition determination results according to the rule that the merged data acquisition determination result is x (ex) for the case in which both data acquisition determination results are x (ex) and the merged data acquisition determination result is ○ (circle) for the case in which both data acquisition determination results are ○ (circles). Further, when the CPU 10 merges a ○ (circle) data acquisition determination result and an x (ex) data acquisition determination result, the merged data acquisition determination result is Δ (triangle). FIG. 12 illustrates data acquisition determination results merged by the CPU 10. It is noted that Δ (triangle) data acquisition determination results are treated as x (ex) data acquisition determination results in the following processes.

The CPU 10 uses the data acquisition determination results merged in OP301 to perform the processes in the operations subsequent to OP302 to adjust the phases of the DQS signals and the DQ signals. Therefore, since the data acquisition determination results are calculated for each memory device of the memory module in the present embodiment, the phases of the DQS signals and the DQ signals can be adjusted between the memory devices with different Ranks.

Third Embodiment

Figure 14:
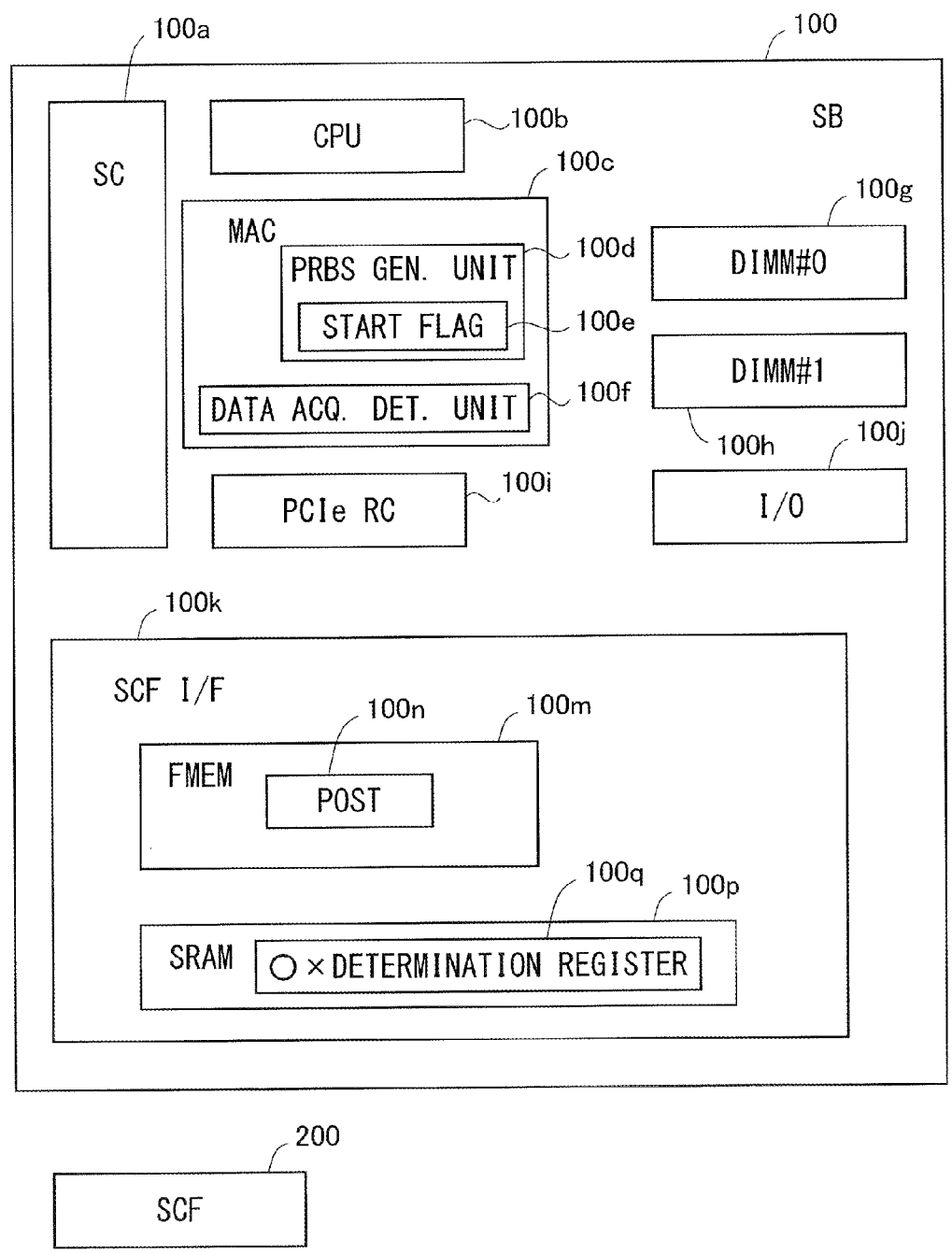
FIG. 14 is a diagram schematically illustrating a configuration of a server system according to an embodiment.
Figure 15:
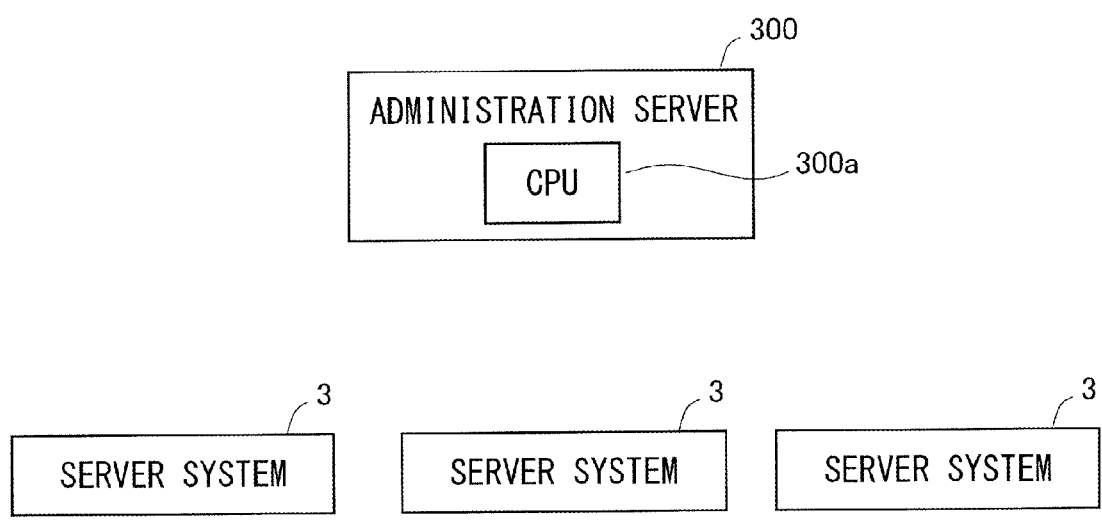
FIG. 15 is a diagram schematically illustrating a configuration of an information processing system according to an embodiment.

Next, the third embodiment is described with reference to the drawings. The phases of the DQS signals and the DQ signals are adjusted in the server system 3 in the present embodiment. FIG. 14 schematically illustrates the configurations of the server system 3.

The server system 3 includes a system board (SB) 100 and a system control facility (SCF) 200. The system board 100 includes a system controller (SC) 100a, a CPU 100b, a memory access controller (MAC) 100c, a dual in-line memory module (DIMM) #0 100g, a DIMM #1 100h, a PCIe riser card (RC) 100i, an Input/Output 100j and an SCF I/F 100k. The MAC 100c includes a PRBS generation unit 100d and a data acquisition determination unit 100f. The PRBS generation unit 100d includes a start flag 100e. It is noted that the PRBS generation unit 100d, the start flag 100e and the data acquisition determination unit 100f correspond to the PRBS generation unit 20b, the start flag 20d and the data acquisition determination unit 20c, respectively, in the embodiment as described above.

The system control facility 200 controls the ON and OFF of the power supply for the system board 100. When the system control facility 200 powers the system board 100 on, the CPU 100b of the system board 100 starts to operate and performs the processes as described below. The system controller 100*a* controls accesses between the CPU 100*b*, the MAC 100*c*, the PCIe RC 100*i* and the SCF I/F 100*k* etc. The MAC 100*c* controls accesses to the DIMM #0 100*g* and DIMM #1 100*h*. And the PCIe RC 100*i* is a riser card for PCI Express and is connected with the I/O 100*j*.

The SCF I/F 100*k* is an interface for connecting the system board 100 with the SCF 200. The SCF I/F 100*k* includes non-volatile memory (FMEM) 100*m* and static random access memory (SRAM) 100*p*. The non-volatile memory 100*m* stores a power on self test (POST) program 100*n*. The POST program 100*n* is a program for performing initial settings for the hardware in the system board 100 and diagnoses for error detection in the system board 100. The SRAM 100*p* includes a data acquisition determination register 100*q*. The data acquisition determination register 100*q* corresponds to the data acquisition determination register 20*e* in the embodiment as described above.

When the server system 3 is powered on, the system control facility 200 powers the system board 100 on and the CPU 100*b* starts to operate. The CPU 100*b* executes the POST program 100*n* stored in the non-volatile memory 100*m* of the SCF I/F 100*k*.

The initial settings of the MAX 100*c*, the DIMM #0 100*g* and the DIMM #1 100*h* are not performed at the stage when the POST program 100*n* is initiated. Therefore, the memory areas of the DIMM #0 100*g* and the DIMM #1 100*h* cannot be used at this stage. And the SRAM 100*p* is used as a work area for the POST program 100*n*. The CPU 100*b* starts to perform the processes in the flowchart in FIG. 3 when the initial settings of the DIMM #0 100*g* and the DIMM #1 100*h* are performed in the POST program 100*n*. It is noted that the descriptions for the following processes similar to the processes in the above embodiments are omitted. In the present embodiment, the phases of the DQS signals and the DQ signals for writing and reading data to the DIMM #0 100*g* are adjusted.

In OP101, the MAC 100*c* determines whether the start flag 100*e* is set to ON. When the MAC 100*c* determines that the start flag 100*e* is set to ON, the MAC 100*c* starts to adjust the phases of the DQS signals and the DQ signals. And the process proceeds to OP102. In OP102, the MAC 100*c* controls the PRBS generation unit 100*d* to generate PRBS random pattern signals. And in OP103, the MAC 100*c* sends WRITE commands for writing the generated PRBS random pattern signals to the DIMM #0 100*g*.

When the process proceeds from OP106 to OP107, the MAC 100*c* sends READ commands to the DIMM #0 100*g*. And the MAC 100*c* performs the reading processes for reading the PRBS random patterns written to the DIMM #0 100*g* in OP103. In OP108, the MAC 100*c* performs data acquisition determination processes for each random pattern read from the DIMM #0 100*g* similar to the above embodiments. And in OP 109, the MAC stores the data acquisition determination results in the data acquisition determination register 100*q* in the SRAM 100*p*.

When the process proceeds from OP110 to OP111, the CPU 100*b* performs the processes in OP201 to OP217 in FIGS. 7 and 8 according to the data acquisition determination results stored in the data acquisition determination register 100*q*. The data acquisition determination results stored in the data acquisition determination register 100*q* are similar to the data acquisition determination results as illustrated in FIG. 6. Therefore, the CPU 100*b* can determine the optimum Vrefs for the DQ signals from DQ0 to DQ3 in the present embodiment.

When the CPU 100*b* completes the process in OP111, the process proceeds to OP112. In OP112, the CPU 100*b* performs the processes in OP301 to OP307 according to the data acquisition determination results stored in the data acquisition determination register 100*q*. In OP301, the CPU 100*b* uses the data acquisition determination results stored in the data acquisition determination register 100*q* to extract the data acquisition determination results for the optimum Vref for each DQ signal. The extracted data acquisition determination results are similar to the data acquisition determination results as illustrated in FIG. 10A. Therefore, the CPU 100*b* performs the processes in OP302 to OP307 to adjust the phases of the DQS signals and the DQ signals as illustrated in FIGS. 10B to 10D.

The phases of the DQS signals and the DQ signals are adjusted when the server system 3 executes the POST program in the present embodiment. The server system 3 boots the OS to perform a variety of processes after the POST program is executed. In the processes performed by the server system 3, data is written to and read from the DIMM #0 100*g* with the phases of the DQS signals and the DQ signals adjusted as above.

In the server system 3, there can be variations with time of the properties of the transmission lines used in the CPU 100*b*, the DIMM #0 100*g* and the system board 100. In the present embodiment, the phases of the DQS signals and the DQ signals can be adjusted according to the results of the writing and reading tests to the memory. Therefore, even when there are such variations of the properties, the optimum strobe points for the DQS signals can be determined.

Although the present embodiment is described as above, the configurations and the processes of the information processing apparatus 1 and the server system 3 are not limited to those as described above and various variations may be made to the embodiment described herein within the technical scope of the above embodiment. For example, the reading test to the memory using the PRBS random patterns is performed in OP102 to OP105 in FIG. 4. However, a writing test to the memory using the PRBS random patterns can be performed instead. Specifically, the process in OP105 is omitted and an interval is not provided when PRBS random patterns are written to the memory.

In addition, the phases of the DQS signals and the DQ signals are adjusted based on the data acquisition determination results to the DIMM #0 100*g* in the server system 3. However, the phases of the DQS signals and the DQ signals can be adjusted based on the data acquisition determination results to the DIMM #1 100*h* instead. Further, the phases of the DQS signals and the DQ signals can be adjusted as described in the second embodiment based on both of the data acquisition determination results to the DIMM #0 100*g* and the DIMM #1 100*h*.

Moreover, the delay tap setting unit can set delay taps on the side on which the phases of the DQS signals and the DQ signals are delayed. However, when offsets are set for the delay taps to the delay tap setting unit in advance, the delay taps can be set on the side on which DQS signals and the DQ signals are advanced. In this case, the flowchart can be modified to omit the processes in OP304 and OP305 to achieve that the process proceeds from OP303 to OP306. With this modification, the phases of the DQS signals and the DQ signals can be adjusted as described above.

Furthermore, an information processing system 4 in which the administration server 300 administers a plurality of server systems 3 can be employed in another embodiment. Since the server systems 3 are similar to the server system 3 as illustrated in FIG. 14 in the third embodiment, the detailed descriptions of the server systems are omitted here. It is noted that the server system 3 in the present embodiment corresponds to an example of an adjustment apparatus configured to adjust the phase relation between a data signal and a strobe signal. In addition, the administration server 300 corresponds to an example of an administration apparatus configured to administer the adjustment apparatus. The CPU 300*a* of the administration server 300 controls the SCF 200 of the server system 3 in the information processing system 4. The SCF 200 powers the system board 100 on according to the control by the CPU 300*a* and performs the processes as described in the third embodiment. As a result, the phases of the DQS signals and the DQ signals are adjusted in each server system 3 in the information processing system 4.

<<Computer Readable Recording Medium>>

It is possible to record a program which causes a computer to implement any of the functions described above on a computer readable recording medium. In addition, by causing the computer to read in the program from the recording medium and execute it, the function thereof can be provided.

The computer readable recording medium mentioned herein indicates a recording medium which stores information such as data and a program by an electric, magnetic, optical, mechanical, or chemical operation and allows the stored information to be read from the computer. Of such recording media, those detachable from the computer include, e.g., a flexible disk, a magneto-optical disk, a CD-ROM, a CD-R/W, a DVD, a DAT, an 8-m tape, and a memory card. Of such recording media, those fixed to the computer include a hard disk and a ROM (Read Only Memory).

According to one aspect, the information processing apparatus can set a strobe point at which the possibility that the acquisition of a data signal is successful can be enhanced even when there are phase variations between signals and wave distortions of the signals.

All example and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An information processing apparatus configured to adjust a phase relation between a data signal and a strobe signal, the information processing apparatus comprising:
   a processor; and
   memory storing instructions for causing the processor to execute:
      identifying, for each of a plurality of candidates for reference values used to perform a determination regarding a value of the data signal, at least one phase difference between the data signal and the strobe signal for successfully acquiring the data signal according to the strobe signal;
      determining a reference value of the plurality of candidates for which a period for successfully acquiring the data signal is longer than periods for any other candidates based on the identified phase difference for each candidate; and
      adjusting the phase relation between the data signal and the strobe signal based on the period for the determined reference value.

2. The information processing apparatus according to claim 1, wherein when there are a plurality of reference values for which the period for successfully acquiring the data signal is longer than periods for any other candidates, the determining compares each period for successfully acquiring the data signal for each reference value next to the plurality of reference values and determines one of the plurality of reference values for which the period for the reference value next to the one of the plurality of reference values is longer than the periods for any other reference values as the reference value for which the period for successfully acquiring the data signal is longer than periods for any other candidates.

3. The information processing apparatus according to claim 1, wherein the data signal is transmitted to first memory or second memory, and
   the determining determines, for each of the plurality of candidates, a shorter period between a period for successfully acquiring the data signal when the data signal is transmitted to the first memory and a period for successfully acquiring the data signal when the data signal is transmitted to the second memory, and determines a reference value of the plurality of candidates for which the period is the longest among the determined shorter periods as the reference value for which the period for successfully acquiring the data signal is longer than periods for any other candidates.

4. The information processing apparatus according to claim 1, wherein the adjusting delays the phase of the strobe signal to a predetermined target phase and delays the phase of the data signal using the predetermined target phase to advance the phase of the data signal with reference to the phase of the strobe signal, and
   the adjusting delays the phase of the data signal without shifting the phase of the strobe signal to delay the phase of the data signal with reference to the phase of the strobe signal.

5. The information processing apparatus according to claim 1, wherein the data signal includes a first part of the data signal transmitted via a first transmission line and a second part of the data signal transmitted via a second transmission line,
   the adjusting matches the phase of the strobe signal determined based on the period for the determined reference value for the first part of the data signal with the phase of the strobe signal determined based on the period for the determined reference value for the second part of the data signal, and
   the adjusting shifting the phase of the first part of the data signal and the phase of the second part of the data signal based on the matched phase of the strobe signal.

6. An information processing system including an adjustment apparatus configured to adjust a phase relation between a data signal and a strobe signal and an administration apparatus configured to administer the adjustment apparatus, wherein adjustment apparatus comprises:
   a processor; and
   memory storing instructions for causing the processor to execute:
      identifying, for each of a plurality of candidates for reference values used to perform a determination regarding a value of the data signal, at least one phase difference between the data signal and the strobe signal for successfully acquiring the data signal according to the strobe signal;

determining a reference value of the plurality of candidates for which a period for successfully acquiring the data signal is longer than periods for any other candidates based on the identified phase difference for each candidate; and adjusting the phase relation between the data signal and the strobe signal based on the period for the determined reference value.

7. The information processing system according to claim 6, wherein when there are a plurality of reference values for which the period for successfully acquiring the data signal is longer than periods for any other candidates, the determining compares each period for successfully acquiring the data signal for each reference value next to the plurality of reference values and determines one of the plurality of reference values for which the period for the reference value next to the one of the plurality of reference values is longer than the periods for any other reference values as the reference value for which the period for successfully acquiring the data signal is longer than periods for any other candidates.

8. The information processing system according to claim 6, wherein the data signal is transmitted to first memory or second memory, and the determining determines, for each of the plurality of candidates, a shorter period between a period for successfully acquiring the data signal when the data signal is transmitted to the first memory and a period for successfully acquiring the data signal when the data signal is transmitted to the second memory, and determines a reference value of the plurality of candidates for which the period is the longest among the determined shorter periods as the reference value for which the period for successfully acquiring the data signal is longer than periods for any other candidates.

9. The information processing system according to claim 6, wherein the adjusting delays the phase of the strobe signal to a predetermined target phase and delays the phase of the data signal using the predetermined target phase to advance the phase of the data signal with reference to the phase of the strobe signal, and the adjusting delays the phase of the data signal without shifting the phase of the strobe signal to delay the phase of the data signal with reference to the phase of the strobe signal.

10. The information processing system according to claim 6, wherein the data signal includes a first part of the data signal transmitted via a first transmission line and a second part of the data signal transmitted via a second transmission line, the adjusting matches the phase of the strobe signal determined based on the period for the determined reference value for the first part of the data signal with the phase of the strobe signal determined based on the period for the determined reference value for the second part of the data signal, and the adjusting shifting the phase of the first part of the data signal and the phase of the second part of the data signal based on the matched phase of the strobe signal.

11. A method of adjusting a phase relation between a data signal and a strobe signal, the method comprising:

identifying, by a computer, for each of a plurality of candidates for reference values used to perform a determination regarding a value of the data signal, at least one phase difference between the data signal and the strobe signal for successfully acquiring the data signal according to the strobe signal;

determining, by the computer, a reference value of the plurality of candidates for which a period for successfully acquiring the data signal is longer than periods for any other candidates based on the identified phase difference for each candidate; and adjusting, by the computer, the phase relation between the data signal and the strobe signal based on the period for the determined reference value.

12. The method according to claim 11, wherein when there are a plurality of reference values for which the period for successfully acquiring the data signal is longer than periods for any other candidates, the determining compares each period for successfully acquiring the data signal for each reference value next to the plurality of reference values and determines one of the plurality of reference values for which the period for the reference value next to the one of the plurality of reference values is longer than the periods for any other reference values as the reference value for which the period for successfully acquiring the data signal is longer than periods for any other candidates.

13. The method according to claim 11, wherein the data signal is transmitted to first memory or second memory, and the determining determines, for each of the plurality of candidates, a shorter period between a period for successfully acquiring the data signal when the data signal is transmitted to the first memory and a period for successfully acquiring the data signal when the data signal is transmitted to the second memory, and determines a reference value of the plurality of candidates for which the period is the longest among the determined shorter periods as the reference value for which the period for successfully acquiring the data signal is longer than periods for any other candidates.

14. The method according to claim 11, wherein the adjusting delays the phase of the strobe signal to a predetermined target phase and delays the phase of the data signal using the predetermined target phase to advance the phase of the data signal with reference to the phase of the strobe signal, and the adjusting delays the phase of the data signal without shifting the phase of the strobe signal to delay the phase of the data signal with reference to the phase of the strobe signal.

15. The method according to claim 11, wherein the data signal includes a first part of the data signal transmitted via a first transmission line and a second part of the data signal transmitted via a second transmission line, the adjusting matches the phase of the strobe signal determined based on the period for the determined reference value for the first part of the data signal with the phase of the strobe signal determined based on the period for the determined reference value for the second part of the data signal, and the adjusting shifting the phase of the first part of the data signal and the phase of the second part of the data signal based on the matched phase of the strobe signal.

16. A non-transitory computer-readable recording medium storing a program that causes a computer to execute a process comprising:

identifying, for each of a plurality of candidates for reference values used to perform a determination regarding a value of the data signal, at least one phase difference between the data signal and the strobe signal for successfully acquiring the data signal according to the strobe signal;

determining a reference value of the plurality of candidates for which a period for successfully acquiring the data signal is longer than periods for any other candidates based on the identified phase difference for each candidate; and adjusting the phase relation between the data signal and the strobe signal based on the period for the determined reference value.

17. The non-transitory computer-readable recording medium according to claim 16, wherein when there are a plurality of reference values for which the period for successfully acquiring the data signal is longer than periods for any other candidates, the determining compares each period for successfully acquiring the data signal for each reference value next to the plurality of reference values and determines one of the plurality of reference values for which the period for the reference value next to the one of the plurality of reference values is longer than the periods for any other reference values as the reference value for which the period for successfully acquiring the data signal is longer than periods for any other candidates.

18. The non-transitory computer-readable recording medium according to claim 16, wherein the data signal is transmitted to first memory or second memory, and the determining determines, for each of the plurality of candidates, a shorter period between a period for successfully acquiring the data signal when the data signal is transmitted to the first memory and a period for successfully acquiring the data signal when the data signal is transmitted to the second memory, and determines a reference value of the plurality of candidates for which the period is the longest among the determined shorter periods as the reference value for which the period for successfully acquiring the data signal is longer than periods for any other candidates.

19. The non-transitory computer-readable recording medium according to claim 16, wherein the adjusting delays the phase of the strobe signal to a predetermined target phase and delays the phase of the data signal using the predetermined target phase to advance the phase of the data signal with reference to the phase of the strobe signal, and the adjusting delays the phase of the data signal without shifting the phase of the strobe signal to delay the phase of the data signal with reference to the phase of the strobe signal.

20. The non-transitory computer-readable recording medium according to claim 16, wherein the data signal includes a first part of the data signal transmitted via a first transmission line and a second part of the data signal transmitted via a second transmission line, the adjusting matches the phase of the strobe signal determined based on the period for the determined reference value for the first part of the data signal with the phase of the strobe signal determined based on the period for the determined reference value for the second part of the data signal, and the adjusting shifting the phase of the first part of the data signal and the phase of the second part of the data signal based on the matched phase of the strobe signal.

* * * * *